(12) United States Patent
Van Nooten et al.

(10) Patent No.: US 7,608,549 B2
(45) Date of Patent: Oct. 27, 2009

(54) METHOD OF FORMING NON-CONFORMAL LAYERS

(75) Inventors: Sebastian E. Van Nooten, Bilthoven (NL); Jan Willem Maes, Wilrijk (BE); Steven Marcus, Tempe, AZ (US); Glen Wilk, Scottsdale, AZ (US); Petri Räisänen, Gilbert, AZ (US); Kai-Erik Elers, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 411 days.

(21) Appl. No.: 11/375,588

(22) Filed: Mar. 13, 2006

(65) Prior Publication Data

US 2007/0026540 A1 Feb. 1, 2007

Related U.S. Application Data

(60) Provisional application No. 60/662,312, filed on Mar. 15, 2005.

(51) Int. Cl.
*H01L 21/31* (2006.01)
*H01L 21/469* (2006.01)

(52) U.S. Cl. .............................. 438/758; 257/E21.019
(58) Field of Classification Search ................ 438/758; 257/E21.019
See application file for complete search history.

(56) References Cited

U.S. PATENT DOCUMENTS

| | | | |
|---|---|---|---|
| 5,453,305 A | 9/1995 | Lee | |
| 5,879,459 A | 3/1999 | Gadgil et al. | |
| 5,904,780 A | 5/1999 | Tomoyasu | |
| 6,342,277 B1 | 1/2002 | Sherman | |
| 6,380,081 B1 | 4/2002 | Lee | |
| 6,426,117 B1 | 7/2002 | Yi et al. | |
| 6,432,205 B1 | 8/2002 | Lee et al. | |
| 6,455,445 B2 | 9/2002 | Matsuki | |
| 6,482,733 B2 | 11/2002 | Raaijmakers et al. | |
| 6,511,539 B1 | 1/2003 | Raaijmakers | |

(Continued)

FOREIGN PATENT DOCUMENTS

WO WO 00/13207 3/2000

(Continued)

*Primary Examiner*—Kiesha L Rose
*Assistant Examiner*—Igwe U Anya
(74) *Attorney, Agent, or Firm*—Knobbe, Martens Olson & Bear, LLP

(57) ABSTRACT

In one aspect, non-conformal layers are formed by variations of plasma enhanced atomic layer deposition, where one or more of pulse duration, separation, RF power on-time, reactant concentration, pressure and electrode spacing are varied from true self-saturating reactions to operate in a depletion-effect mode. Deposition thus takes place close to the substrate surface but is controlled to terminate after reaching a specified distance into openings (e.g., deep DRAM trenches, pores, etc.). Reactor configurations that are suited to such modulation include showerhead, in situ plasma reactors, particularly with adjustable electrode spacing. In another aspect, alternately and sequentially contacting a substrate, the substrate including openings, with at least two different reactants, wherein an under-saturated dose of at least one of the reactants has been predetermined and the under-saturated dose is provided uniformly across the substrate surface, deposits a film that less than fully covers surfaces of the openings, leading to depletion effects in less accessible regions on the substrate surface.

26 Claims, 9 Drawing Sheets

U.S. PATENT DOCUMENTS

| | | |
|---|---|---|
| 6,539,891 B1 | 4/2003 | Lee et al. |
| 6,579,374 B2 | 6/2003 | Bondestam et al. |
| 6,610,189 B2 | 8/2003 | Wang et al. |
| 6,623,799 B1 | 9/2003 | Lee et al. |
| 6,645,574 B1 | 11/2003 | Lee et al. |
| 6,677,218 B2 | 1/2004 | Kirchhoff et al. |
| 6,699,783 B2 | 3/2004 | Raaijmakers et al. |
| 6,720,262 B2 | 4/2004 | Koh et al. |
| 6,759,325 B2 | 7/2004 | Raaijmakers et al. |
| 6,820,570 B2 | 11/2004 | Kilpela et al. |
| 2001/0054769 A1* | 12/2001 | Raaijmakers et al. ....... 257/758 |
| 2002/0011215 A1 | 1/2002 | Tei et al. |
| 2003/0010452 A1 | 1/2003 | Park et al. |
| 2003/0129828 A1* | 7/2003 | Cohen .................... 438/629 |
| 2003/0143328 A1 | 7/2003 | Chen et al. |
| 2004/0009307 A1 | 1/2004 | Koh et al. |
| 2004/0083961 A1* | 5/2004 | Basceri .................... 118/715 |
| 2004/0115898 A1* | 6/2004 | Moghadam et al. ......... 438/435 |
| 2004/0142558 A1* | 7/2004 | Granneman .............. 438/680 |
| 2004/0216665 A1 | 11/2004 | Soininen et al. |
| 2004/0216668 A1 | 11/2004 | Lindfors et al. |
| 2004/0241668 A1 | 12/2004 | Amorese et al. |
| 2005/0036051 A1* | 2/2005 | Ueno et al. ................ 348/308 |
| 2005/0095780 A1* | 5/2005 | Gutsche et al. ............ 438/243 |
| 2005/0124154 A1* | 6/2005 | Park et al. .................. 438/643 |
| 2005/0158945 A1 | 7/2005 | Birner et al. |
| 2005/0160983 A1* | 7/2005 | Sneh ....................... 118/715 |
| 2005/0164464 A1 | 7/2005 | Hecht et al. |
| 2005/0181555 A1 | 8/2005 | Haukka et al. |
| 2005/0266173 A1 | 12/2005 | Brcka |
| 2005/0277265 A1 | 12/2005 | Cha et al. |
| 2006/0216419 A1 | 9/2006 | Shero et al. |
| 2006/0216932 A1 | 9/2006 | Kumar et al. |

FOREIGN PATENT DOCUMENTS

| | | |
|---|---|---|
| WO | WO 00/55895 | 9/2000 |
| WO | WO 00/69576 | 11/2000 |
| WO | WO 01/78123 | 10/2001 |
| WO | WO 01/99166 | 12/2001 |
| WO | WO 02/063666 | 8/2002 |
| WO | WO 03/023835 | 3/2003 |
| WO | WO 03/041141 | 5/2003 |
| WO | WO 03/041142 | 5/2003 |
| WO | WO 03/056612 | 7/2003 |
| WO | WO 2004/017394 | 2/2004 |

* cited by examiner

# METHOD OF FORMING NON-CONFORMAL LAYERS

REFERENCE TO RELATED APPLICATIONS

The present application claims priority to U.S. Provisional Application No. 60/662,312, filed Mar. 15, 2005, the disclosure of which is incorporated by reference herein.

FIELD OF THE INVENTION

This invention relates generally to forming non-conformal layers over stepped topography. More particularly, the invention relates to controlling conformality of thin films in integrated circuit fabrication using alternating and sequential deposition.

BACKGROUND OF THE INVENTION

A variety of deposition techniques are used in the fabrication of integrated circuits, including physical vapor deposition (PVD), chemical vapor deposition (CVD) and, more recently, atomic layer deposition (ALD).

In ALD, reactants are supplied to the workpiece in alternating pulses in a cycle. Preferably, each cycle forms no more than about one monolayer of lining material by adsorption and preferably by chemisorption. The substrate temperature is kept within a window facilitating chemisorption. In particular, the substrate temperature is maintained at a temperature low enough to maintain intact bonds between adsorbed species and the underlying surface, and to prevent decomposition of the reactant species. On the other hand, the substrate temperature is maintained at a high enough level to avoid condensation of reactants and to provide the activation energy for the desired surface reactions in each phase. Of course, the appropriate temperature window for any given ALD reaction will depend upon the surface termination and reactant species involved.

Each pulse or phase of each cycle is preferably self-limiting in effect. In the examples set forth below, each of the phases are self-terminating (i.e., an adsorbed and preferably chemisorbed monolayer is left with a surface non-reactive with the chemistry of that phase). An excess of reactant precursors is supplied in each phase to saturate the structure surfaces. Surface saturation ensures reactant occupation of all available reactive sites (subject to physical size restraints, as discussed in more detail below), while self-termination prevents excess film growth at locations subject to longer exposure to the reactants. Together, saturation and self-terminating chemistries ensure excellent step coverage.

As will be understood from the above, ALD affords much greater conformality than PVD or CVD processes. However, less than perfect conformality is sometimes desirable. For example, U.S. Patent No. 6,482,733 describes a damascene metallization process in which a non-conformal process, such as PVD or CVD, is first conducted to seal pores in the trench and via sidewalls of a porous, low k insulating layer. A subsequent ALD process conformally lines the trench and via walls without depositing conductive material deep into the pores of the insulating material. CVD and PVD, however, provide limited control over the conformality of the deposition.

U.S. Pat. No. 6,759,325 ("'325 patent"), the disclosure of which is incorporated herein by reference, describes a process in which the conformality of the deposition can be more finely controlled. The '325 patent describes methods allowing tailored conformality, ranging from the near perfect conformality of ALD to the level of conformality afforded by chemical vapor deposition (CVD). In particular, the methods include an alternating deposition process, whereby a plurality of sequential reactant pulses are separated from one another. This alternating process is optimized to achieve a level of conformality between that of atomic layer deposition (ALD) and chemical vapor deposition. A sequence is provided of at least two different, mutually reactive reactants in temporally separated and alternating reactant pulses. Separations of the reactant pulses and durations of the reactant pulses are selected to control the conformality of the film deposited in the openings in the surface of the semiconductor substrate, wherein the separations and durations are selected to achieve reduced conformality compared to a corresponding atomic layer deposition (ALD) process that is optimized to achieve maximum conformality with minimum cycle length for the substrate topography. The semiconductor substrate is exposed to the sequence of the reactant pulses with the selected separations and durations to deposit the film.

SUMMARY OF THE INVENTION

In accordance with some aspects of the invention, methods are provided for depositing a film on a semiconductor substrate. The methods include providing a substrate, the substrate having at a surface thereof different regions with different levels of accessibility. A sequence of at least two different reactants are provided in temporally separated and alternating reactant pulses, wherein at least one of the at least two different reactants is provided through a showerhead or otherwise provided in that it impinges vertically on the substrate. Reaction conditions are selected to achieve self-saturating and self-limiting atomic layer deposition (ALD) mode deposition on the most accessible regions on the substrate surface and depletion effects in less accessible regions on the substrate surface. The semiconductor substrate is exposed to the sequence of the reactant pulses with the selected temporal separations and durations to deposit the film. In some embodiments, the reaction conditions are plasma enhanced atomic layer deposition (PEALD) reaction conditions. In other embodiments, the reaction conditions that are adjusted include the dose of one of the reactants.

In accordance with other aspects of the invention, non-conformal deposition is provided by plasma vapor deposition processes using alternating and sequential vapor phase reactant pulses. In particular, one or more plasma deposition parameters are adjusted, relative to true self-limiting atomic layer deposition (ALD) operation, to reduce conformality in a controlled manner. In illustrated embodiments, two or more reactants are alternately and sequentially supplied to a substrate having a stepped topography. One or more of the two or more reactants is a reactive species activated by the plasma. Reaction parameters or variables that can be adjusted to result in non-conformal deposition include, without limitation, the temporal separation between reactant pulses, RF power on-time, chamber pressure, reactant concentration in a given pulse, plasma power, and electrode spacing.

In accordance with yet other aspects of the invention, non-conformal deposition using alternate and sequential reactant pulses is performed in a vapor deposition tool employing a showerhead design that uniformly distributes reactants across the substrate. Accordingly, while operating in a depletion mode such that non-uniformity obtains in a direction into openings in the substrate, uniform results can still be obtained laterally across the substrate. Preferably, the vapor deposition toll is a plasma-enhanced vapor deposition tool.

In accordance with still other aspects of the invention, methods are provided for controlling conformality of a deposited film on a semiconductor substrate. The methods include providing the substrate with a plurality of openings at a surface thereof. Pulses of at least two different reactants are alternately and sequentially supplied to the substrate. At least one of the two different reactants is selectively activated. The selective activation is controlled to have a depletion effect within the openings to less than fully cover surfaces of the openings.

In accordance with still other aspects of the invention, the conformality of vapor deposition processes is adjusted by manipulating one or more reaction variables, such as reactant dose. Preferably, at least one reactant is provided through a showerhead. In accordance with some embodiments, the depletion of non-radical reactants is controlled to provide deposition on accessible regions of a structure and not on other regions by providing an under-saturated pulse of at least one reactant. For example, an under-saturated dose of one or more reactants may provide deposition at the top of a feature, such as a trench, but not at the bottom.

In accordance with still other aspects of the invention, methods are provided for controlling conformality of a deposited film on a semiconductor substrate comprising a plurality of openings at a surface thereof. The methods comprise alternately and sequentially contacting a substrate with at least two different reactants, wherein an under-saturated dose of at least one of the reactants has been predetermined and the under-saturated dose is provided uniformly across the substrate surface such that the deposited film less than fully covers surfaces of the openings. Preferably, at least one reactant is provided through a showerhead.

In accordance with still other aspects of the invention, methods of partially lining a trench in a substrate in a reaction space by an atomic layer deposition (ALD) reaction are provided. The methods comprise contacting the substrate with a saturating dose of a first reactant to form a monolayer of the first reactant over the surfaces of the trench. An under-saturating dose of a second reactant is provided. The substrate is contacted with the entire under-saturating dose of the second reactant, such that the second reactant reacts with a film formed by the first reactant to a desired depth within the trench.

In accordance with a further aspect of the invention, a reactor for depositing a thin film is provided. The reactor preferably comprises a dosage control mechanism and a reaction chamber. The dosage control mechanism is typically used to provide an under-saturating dose of one or more reactants to the reaction chamber. The dosage control mechanism preferably comprises a reactant source vessel and a dosage chamber with a controlled volume, as well as a temperature controlled environment such that the source vessel and dosage chamber can be maintained at the same temperature. The reactor preferably comprises a control system configured to separately control a temperature of the dosage chamber and a temperature of the reaction chamber.

All of these aspects and embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment disclosed.

DETAILED DESCRIPTION OF THE PREFERRED EMBODIMENTS

The methods described herein allow control over the level of step coverage, or conformality, of a vapor deposition process.

Such tailoring can be useful for a variety of situations in which differential conformality is desired for different structures. For example, as described in the incorporated '325 patent, some low k layers have been found to have anisotropic (e.g., primarily vertically aligned) pores may call for a different level of conformality as compared to the conventional porous low k materials. Whereas coverage of sidewall trench/via surfaces is desired for conventional, isotropically porous layers, such sidewall coverage is not necessary when only horizontal surfaces open into continuous pores. In fact, it may be advantageous to avoid full coverage of the sidewalls for a variety of reasons, such as for leaving maximum room in trenches and vias for highly conductive material (e.g., copper), or for avoiding a directional etch to open up a conductivity path on the bottom of the trenches or vias when an insulating sealing layer is selected. An example of sealing porous layers by the processes described herein is provided below with respect to FIG. 4.

Another example of a situation in which non-conformal, but controlled step coverage is desired, is a thin insulating liner layer at the top part of a trench capacitor for dynamic random access memory (DRAM). An example of this upper insulating liner or "collar" layer is described below with respect to FIG. 5.

Although described below primarily in terms of the use of activated species, in some embodiments non-activated reactants are utilized. In view of the discussion of non-activated species provided below, one of skill in the art will be able to adapt the disclosed plasma processes and equipment for use with non-activated species without undue experimentation.

PEALD Reactor Designs

Figure 1:
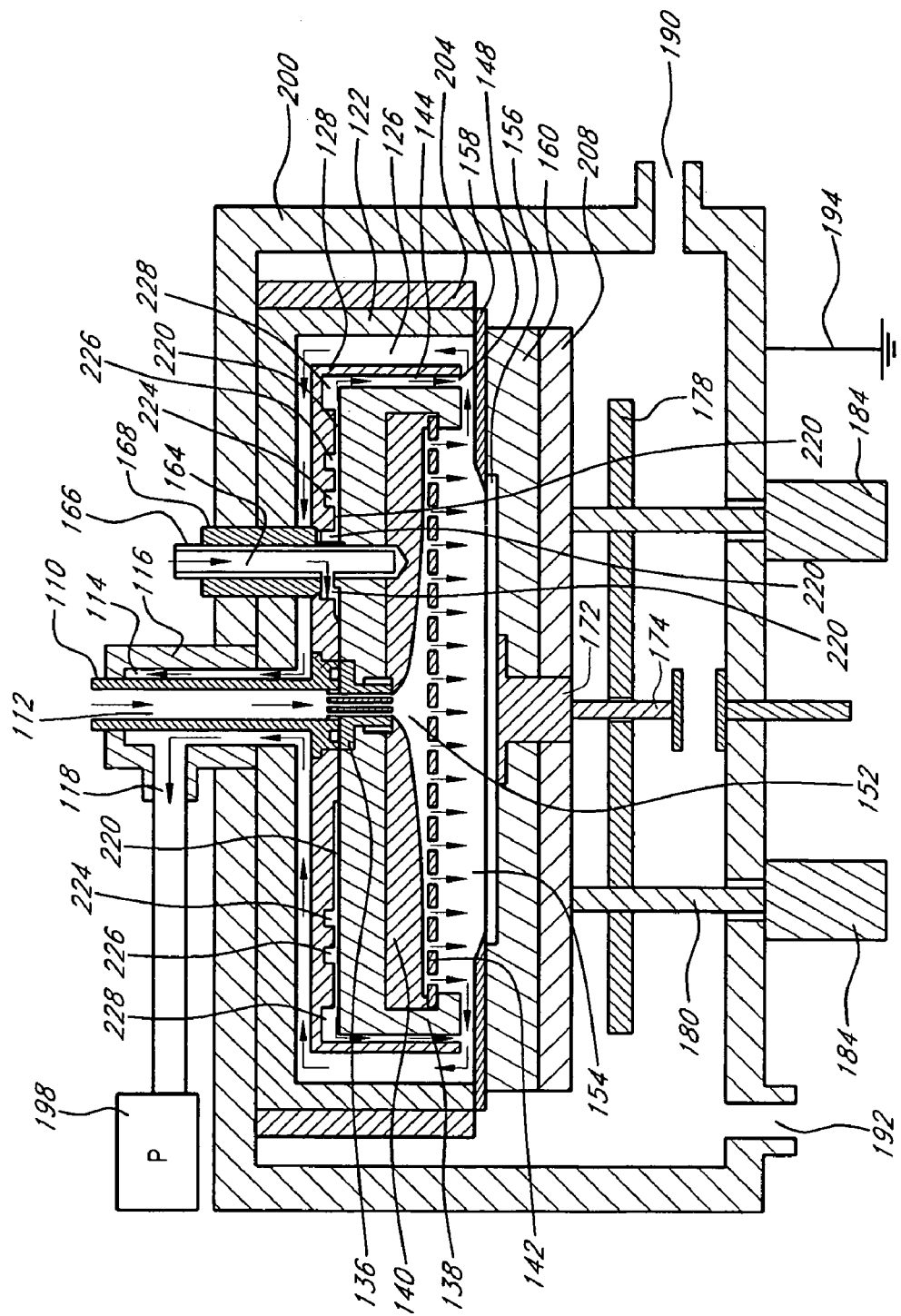
FIG. 1 is a cross-sectional schematic diagram of a reaction chamber with in situ plasma for plasma enhanced atomic layer deposition (ALD), constructed in accordance with one embodiment of the present invention.
Figure 2:
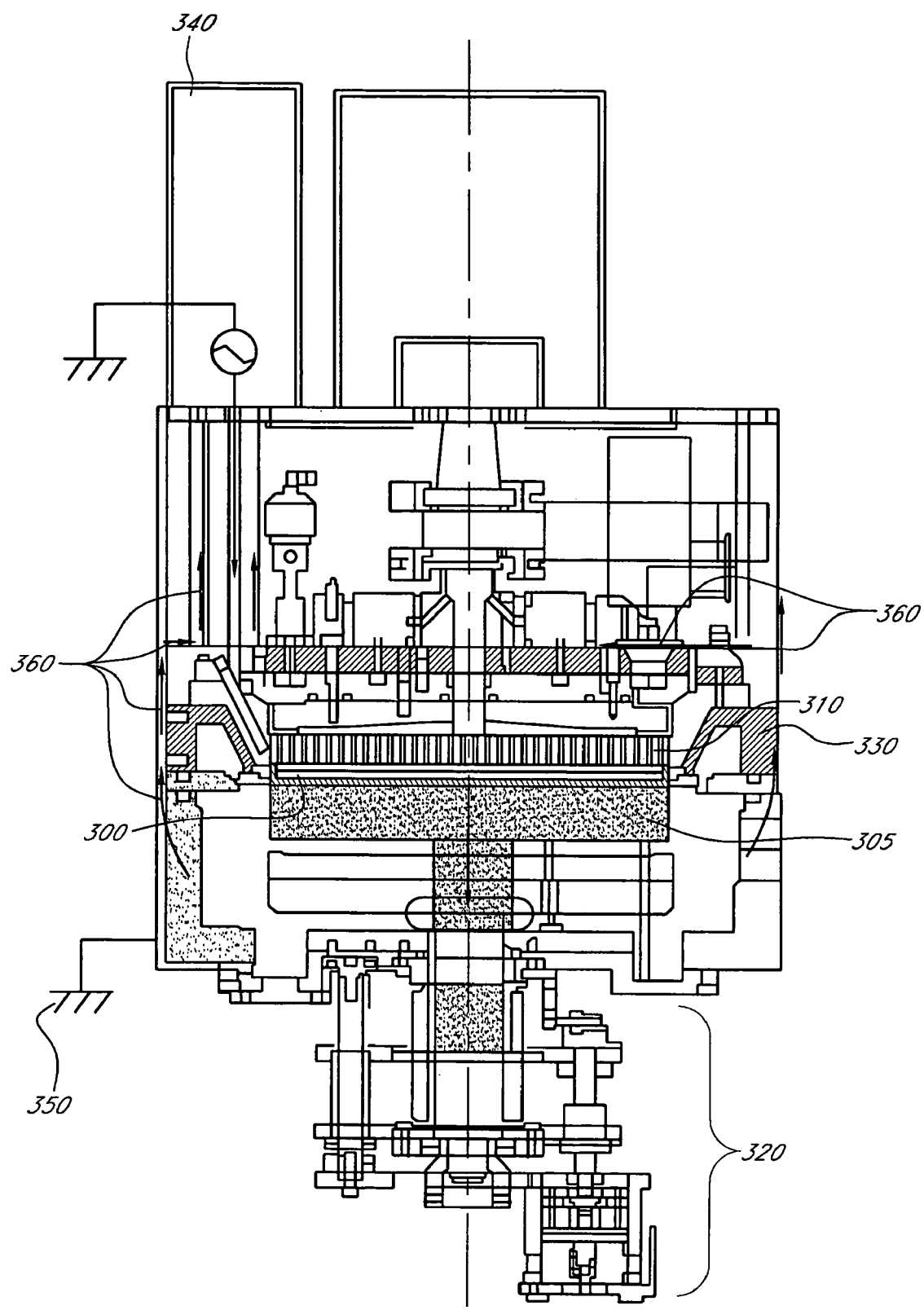
FIG. 2 is a schematic cross-sectional side view of a reaction chamber configured for in situ plasma generation for plasma-enhanced atomic layer deposition (PEALD), constructed in accordance with another embodiment of the present invention.

FIGS. 1 AND 2 schematically illustrate exemplary plasma enhanced atomic layer deposition (PEALD) reactors. The illustrated reactor in FIG. 1 is described in more detail in WO 03/023835 A1, the disclosure of which is incorporated herein by reference. It will be apparent to the skilled artisan, however, that the methods and films described herein can be obtained in other plasma vapor deposition tools. A variety of other reactor designs that are particularly configured for PEALD to ensure control over the separation of reactant pulses are disclosed in U.S. Pat. No. 6,820,570, the disclosure of which is incorporated herein by reference. While any of the reactor designs of U.S. Pat. No. 6,820,570 can be employed for many of the PEALD non-conformal depositions described, the in situ plasma design of the reactor described herein is preferred for the additional control afforded by the adjustable electrode spacing, direct exposure of the substrate to the plasma, adjustable RF power on-time as well as frequency, and/or uniformity of exposure across the substrate, relative to remote plasma systems.

Referring to FIG. 1, a heater 208 is installed at the bottom part of a substrate carrier 160 so that the temperature of a substrate 156 or the reaction space 154 can be controlled. In addition, a heater 204 installed can be provided for the reactor walls 122 to separately control the temperature of the reactor wall and the reaction chamber generally.

At the upper part of the reactor wall 122 is a dual orifice tube assembly 116. At the lower part of the reactor wall 122 is the substrate carrier 160. The substrate carrier 160 and the reactor wall 122 define the inner part of the reactor. A gas sealer ring 158 is located between the top surface of the outer ring of the substrate carrier 160 and the bottom end of the reactor walls 122, and this gas sealer ring 158 is shaped as a thin flat ring, like a washer, having a beveled inner side and a square or vertical walled outer side. The sealer ring forms a seal between the substrate carrier 160 and the reactor wall 122, and extends inwardly to cover the top surface of the outer ring area of the substrate carrier 160. This gas sealer ring 158 prevents the process gas from leaking outside the chamber, and protects the substrate carrier 160 from being exposed to process gases.

A gas inlet tube 110 is mounted as a part of the dual orifice tube assembly 116 at the upper part of the reactor wall 122. The process gas travels in the direction of illustrated arrows through a micro-feeding tube assembly 136 and then into an inner part of a showerhead assembly 152. An outer tube 114 of the dual orifice tube assembly 116 defines a passage way between the inlet tube 110 and the outer tube 114 for flowing exhaust gases.

The showerhead assembly 152 comprises a volume adjusting horn 140 and a gas dispersion perforated grid 142. The shape of the volume adjusting horn 140 allows the process gas to distribute uniformly, evenly and smoothly over the substrate 156, and at the same time minimizes the volume within the showerhead assembly 152. More specifically, the showerhead horn 140 flares open downwardly to reduce the volume of the inner part of the showerhead 152, and such a shape reduces the curling effect of the process gas flow. Accordingly, the process gas is distributed uniformly and evenly. Corners along the flow path within the showerhead 152 would cause trapping of the process gas and turbulence around such corners. Furthermore, the shape of a horn itself makes the flow of the process gas even and uniform. At the bottom part of the volume-adjusting horn 140, the gas dispersion perforated grid 142 is mounted and this makes the flow of the process gas even more uniform, thereby allowing the process gas to be distributed uniformly over the top surface of the substrate 156. The showerhead assembly 152 and the bottom end of the gas inlet tube 110 are connected through the micro-feeding tube assembly 136. Process gas thus enters into the gas inlet tube 110, flows in the direction of arrows indicated, flows through the micro-feeding tube assembly 136 and then to the inner part of the showerhead assembly 152.

As described above, the shape of the volume adjusting horn 140 is designed to minimize its volume for proper processing of a substrate, and yet to let a process gas to flow smoothly and evenly over the substrate 156. The design also facilitates rapid and smooth removal of excess process and exhaust gas and filling an incoming process gas. More specifically, during a sequential supply of process gases, the showerhead design minimizes the possibility of the vapor phase reaction between a new process gas and the residual gas of the previous reactant pulse remaining in the showerhead 152. The dual orifice tube assembly 116 is, as described previously, connected to the inlet opening of the reactor housing wall 122 and the outer tube of the dual orifice tube assembly 116 is connected to a vacuum pump 198 through a gas outlet tube 118.

Therefore, the process gas enters into the reaction space 154 and is dispersed evenly through the gas dispersion perforated grid (or showerhead grid) 142, travels through a gap 126 (passage of removal gas indicated by arrows) between the reactor wall 122 and a plasma generation barrier 128, through the outer tube 114 of the dual orifice tube assembly, through the gas outlet tube 118, and then finally to the vacuum pump 198. In FIG. 1, the arrows indicate the direction of the flow of a process gas.

A radio frequency connecting terminal 166 is made of a metallic tube 164 for receiving radio frequency power from outside and is surrounded by an insulating tube 168. The terminal 166 is connected electrically to both the volume adjusting horn 140 and the gas dispersion perforated grid 142, with positive (+) polarity. The radio frequency connecting terminal 166 is connected to the volume adjusting horn 140 through the reactor body 200, the reactor wall 122, the plasma generation barrier 128 and a showerhead insulation wall 138. Because of the insulating tube 168, the high frequency connecting terminal 166 is electrically insulated from the reactor body 200, the reactor wall 122 and the plasma generation barrier wall 128. The showerhead insulating wall 138 electrically isolates the showerhead assembly 152 from surrounding conductors, except for the radio frequency terminal 166. The gas inlet tube 110 (on an inner tube) is a conductor; however, the micro-feeding tube assembly 136 is made of an insulating material, such that the showerhead assembly 152 is electrically insulated from the reactor wall 122 as well as the reactor body 200.

The substrate 156 and the substrate carrier 160 are electrically connected to ground 194 through a drive shaft 180 and the reactor body 200. Therefore, when radio frequency power is applied by using an RF generator (not shown), plasma is generated between the showerhead assembly 152, which is given a positive (+) polarity, and the combination of the substrate 156 and substrate carrier 160, which acquires a negative (−) polarity. Due to the source gas used and activated by the generated plasma, a thin film is formed on the substrate 156. The plasma is preferably generated only in the reaction space 154 between the gas dispersion perforated grid 142 and the combination of the substrate 156 and the substrate carrier 160.

The plasma generation barrier wall 128 is installed between the showerhead insulation wall 138 and the reactor wall 122 in order to prevent any electrical short between the showerhead assembly 152 and any metallic part within the reactor, such as the reactor wall 122. Such short circuits might otherwise occur due to a formation of a conductive thin film on the surface of the showerhead insulation wall 138, which mounts the showerhead assembly 152 to the reactor body 200. The plasma generation barrier wall 128 is electrically is connected to ground 194 through the gas inlet tube 110 and the reactor body 200. Therefore, plasma is not generated in the exhaust passage 126 between the plasma generation barrier wall 128 and the reactor wall 122. Accordingly, a conductive thin film is not formed in the exhaust passage 126. Furthermore, a supply of inert gas 144 is provided between the showerhead insulation wall 138 and the plasma generation barrier wall 128, allowing plasma to generate even if a conductive thin film forms on a lower tip 148 of the showerhead insulation wall 138 near the substrate carrier 160. By supplying an inert gas continuously through the narrow passage of inert gas 144, plasma generation and formation of a conductive thin film near the tip 148 of the inert gas passage 144 is blocked. This prevents an electrical short between the showerhead assembly 152 (formed by the horn and grid 140, 142) and ground 194 from occurring due to metallic reactants.

As described above, an inert gas such as argon (Ar) flows through the inner tube 164 of the radio frequency connection terminal 166, through the narrow inert gas passage 144 between the showerhead insulation wall 138 and the plasma generation barrier wall 128, outwardly through the gap between the plasma generation barrier wall 128 and the reactor wall 122, and then eventually the inert gas travels through the gas outlet tube 118 to be exhausted through the vacuum pump 198. This inert gas is supplied continuously even during the thin film deposition process, such that formation of a conductive thin film on the surface of the showerhead insulation wall 138 is prevented by blocking the exposure of the top and side parts of the showerhead insulation wall 138 to process gas.

By constructing the micro-feeding tube assembly 136 with fine tubes of small diameter, a plasma can be prevented from forming inside the micro-feeding tube assembly 136.

Four significant features make reactor more suited to plasma enhanced ALD (PEALD), particularly where there is risk of depositing conductive films on the surfaces of the reactor. First, the shape of the volume adjusting horn 140 of the showerhead assembly 152; second, the structure of the micro-feeding tube assembly 136; third, the arrangement of the thin gap 144 provided between the showerhead insulation wall 138 and the plasma generation barrier wall 128 so that an inert gas such as argon (Ar) is continuously supplied; and fourth, efficient electrode connections and configurations are provided by the radio frequency power connecting terminal 166 including a conducting tube 164 and an insulating tube 168 made of an electrically insulating material.

It is possible that plasma generation may take place due to the potential difference between the gas inlet tube 110 and the showerhead assembly 152 (140, 142). The presence of plasma might cause formation of a conductive thin film on the inner surface of the part where the showerhead insulation wall 138 and the showerhead assembly 152 are connected, at the center of the assembly. A conductive thin film formed around the centrally-located hole in the middle of the showerhead insulation wall 138 may cause an electrical short between the showerhead assembly 152 and the gas inlet tube 110. Therefore, in order to suppress undesired plasma generation in the neighborhood of the aforementioned micro-feeding tube assembly 136, the micro-feeding tube assembly 136 is structured with a plurality of small, parallel tubes to connect the showerhead assembly 152 (140, 142) and the gas inlet tube 110 so that the micro-feeding tube assembly 136 suppresses the plasma generation while the inert gas flows steadily.

Aforementioned micro-feeding tube assembly 136 is made of insulating materials. The diameter of the small tubes in the micro-feeding tube assembly 136 is chosen to be small enough so that plasma generation does not occur, yet an adequate amount of gas flows through steadily. In an exemplary arrangement, the over-all diameter of the micro-feeding tube assembly is about 6 mm and its length is about 20 mm and the diameter of the small tubes is about 0.6 mm and eight (8) such micro-tubes are bundled to construct the micro-feeding tube assembly 136. More generally, the feed through from the gas inlet tube 110 to the showerhead assembly 152 preferably comprises more than 4 micro-tubes having a diameter between about 0.2 mm and 2.0 mm each, more preferably more than 6 micro-tubes having a diameter between about 0.4 mm and 0.8 mm.

Instead of using a micro-feeding tube assembly 136 made of insulating material, for connecting the gas inlet tube 110 and the showerhead assembly 152 (140, 142), the passage can be made sufficiently longer than the distance between the gas dispersion perforated grid 142 and the substrate 156 that the occurrence of plasma generation inside these tubes may be prevented. However, to do this, the upper part of the thickness of the showerhead insulation wall 138 would be made thicker and other parts of the reactor assembly would be significantly enlarged, such that the cost and material for constructing such a part would increase.

In order to maintain the state of plasma, the electrons sufficiently accelerated in given electric and magnetic fields collide with the neutral gas particles and such collisions ionize the atoms and molecules, thereby releasing electrons, and in turn, these electrons are accelerated by the fields, and then collide with other neutral gas particles, thereby releasing more electrons. This process repeats itself in order for the state of plasma to be maintained. However, in general, in a small space the electrons collide with solids and loose their energy before such electrons gain sufficient energy for releasing other electrons from neutral gas particles. Accordingly, it is difficult to sustain a plasma in a small space.

Furthermore, referring to FIG. 1, a potential difference between the reactor wall 122 and the showerhead insulation wall 138 may exist and therefore a plasma state may be generated here. The plasma state may include, without limitation, ions (cations and anions) and radicals of one or more vapor phase precursors. As a result, on the inside surface of the reactor wall 122 and the outside surface of the showerhead insulation wall 138, a conducting thin film may be formed due to the reaction of the process gas occurring while such process gas is passing through the reaction space 154, the reactor wall 122, and the showerhead insulation wall 138. Any conducting thin film formed on the outer surface of the showerhead insulation wall 138 may cause an electrical short between the showerhead assembly 152 and the reactor wall 122, which is connected to ground 194.

In order to remedy the problem described above, the plasma generation barrier wall 128 is constructed between the reaction wall 122 and the showerhead insulation wall 138. The plasma generation barrier wall is electrically connected with the reaction wall 122 through the gas inlet tube 110 (inner tube). Accordingly, plasma generation does not take place because there is no potential difference between the plasma generation barrier wall 128 and the reactor wall 122. If the distance (space) between the plasma generation barrier wall 128 and the showerhead insulation wall 138 is reduced, the plasma generation in this neighborhood can be suppressed. In this case, plasma generation takes place mainly in the relatively spacious reaction space 154 between the gas dispersion perforated grid 142 and the substrate 156. Also, by supplying an inert gas such as argon (Ar) continuously during the film formation period through the gaps 144, 148, 126 between the plasma generation barrier wall 128 and the showerhead insulation wall 138 in the direction of arrows, undesired flow of process gases is prevented in the inert gas passage 144.

The inert gas is supplied through the tube-shaped radio-frequency power connection terminal 166. The inert gas is supplied through the hole at the center of the radio frequency power connection terminal 166 and then through the conductive tube 164, and then through the gaps between the showerhead insulation wall 138 and the plasma generation barrier wall 128 as indicated by arrows. The inert gas then travels the gaps and passage ways 220, 224, 226, 228 and then to the inert gas passage 144 and continues to flow following the arrows. It is desirable to provide the illustrate set of passage ways and buffering spaces such as 220, 224, 226 and 228 for proper flow of an inert gas. Such passage ways and buffering spaces are preferably arranged so that a proper, adequate, and smooth flow of the inert gas is achieved.

Such arrangement preferably provides a uniform and even flow of the inert gas throughout the inert gas passage ways as indicated by arrows even if the high frequency connection terminal is positioned off center, as shown in the FIG. 1. In one particular arrangement, the gap size of the inert gas passage 144 and tip 148 is about 0.4 mm, the outside diameter of the showerhead insulation wall 138 is 21 mm, and a gas is supplied at the flow rate of 205 sccm, the flow rate of the gas at the gaps of the passage of inert gas 144 and the end part of the passage of inert gas 148, respectively, is 19 mm/s at the temperature of 251° C. and the pressure of 5 Torr. As the temperature increases, the flow rate increases.

More specifically, referring to FIG. 1, when a inert gas such as argon (Ar) is supplied by using an MFC (mass flow controller) (not shown) through the high frequency connection terminal 166 (serving as an inert gas inlet tube), the inert gas is forcibly supplied through the inlet tube 166 and flows, as indicated by arrows, through a first reservoir ring 220, an inert gas passage way 222, a second reservoir ring 224, a third reservoir ring 226 and a fourth reservoir ring 228, and then through the inert gas passage 144 to the tip 148. At the tip 148, the inert gas flow joins with the excess process and by-product gas and this mixed gas flows through the exhaust passage 126, which is the gap between the plasma generation barrier wall 128 and the reactor wall 122, through the gas outlet tube 118 to the vacuum pump 198.

During this gas flow process, the flow of the inert gas through the inert gas passage tip 148 blocks backflow of the process gas inside of the reaction space 154 through the gap of the passage of inert gas 144. Therefore, when a process gas containing metallic material is used, no undesirable conducting thin film is formed inside of the passage of inert gas 144, particularly around the inert gas passage tip 148, and as a result, it does not create a problem of an electrical short. This prolongs the life of the usage of the areas surrounding the reaction space 154.

A conducting thin film is formed only in the areas where a process gas is supplied and present and the plasma generation occurs. This means that no conductive thin film is formed between the plasma generation wall 128 and the reactor wall 122 because no plasma is generated, and that no conductive thin film is formed between the plasma generation barrier wall 128 and the showerhead insulation wall 138 because no process gas is supplied and present. Consequently, a conducting thin film is formed only within the reaction space 154, where a substrate 156 is located and no conducting thin film is formed outside the reaction space 144, and therefore, an electrical short is blocked even if the process of formation of a conducting thin film is repeated.

A reactor body 200 includes the reactor wall 122 along with the elements installed inside, including the substrate carrier 160, an inert gas inlet tube 190 and an inert gas outlet tube 192 equipped with an on-off valves for gases. The secondary inert gas flow generated by the inlet tube 190 and outlet tube 192 reduces gas leakage by maintaining the pressure level of the secondary inert gas. The high frequency connection terminal 166 is connected to the showerhead assembly 152 though the reactor body 200 and the reactor wall 122, ensuring electrical insulation of the high frequency connection terminal from the reactor body 200 as well as the reactor wall 122.

The reactor body 200 has mainly two parts: a top cover and the bottom body. As described above, leakage inside of the reaction space 154 can be prevented by maintaining the pressure of the inert gas below the carrier 160 higher than the pressure of the gas inside of the reaction space 154. The pressure is supplied by controlling flow through the inert gas inlet tube 190 and the inert gas outlet tube 192.

FIG. 2 schematically illustrates a plasma-enhanced atomic layer deposition (PEALD) reactor constructed in accordance with another embodiment of the invention. A reactor having similar construction is commercially available from ASM International N.V. of Bilthoven, The Netherlands under the trade name EmerALDυ.

As with the embodiment of FIG. 1, the in situ plasma design of the PEALD reactor of FIG. 2 provides particular advantages over other plasma vapor deposition tools. Unlike remote plasma systems, the illustrated reactor provides uniform exposure across the substrate due to a direct plasma generated by a powered showerhead electrode extending over the entire substrate. Variables that can be independently controlled include adjustable RF power on-time, RF power amplitude, frequency, in addition to reactant concentration, chamber pressure, reactant pulse duration and separation, and total gas flow. One benefit provided by the reactor of FIG. 2 relative to that of FIG. 1 is the additional variable provided by adjustable spacing between the substrate/carrier combination 300/305 (which serves as one electrode for RF plasma generation) and the showerhead 310 (which serves as another electrode). In particular, adjustment of spacing between the grounded substrate 300 and the powered showerhead plate 310 alters the density of the plasma and thus the supply of activated reactants. Spacing between the substrate/carrier electrode and the showerhead electrode can be adjusted using a susceptor lift mechanism 320 comprising a stepper motor. In the illustrated embodiment, the substrate/carrier 300/305 to shower head 310 distance can be varied to create a gap of preferably from about 0.5 mm to 100 mm, more preferably from about 1 mm to 50 mm, even more preferably from about 2 mm to 25 mm, still more preferably from about 5 mm to 15 mm. In some embodiments, the carrier 305 is a substrate susceptor configured for absorbing externally-generated energy, such as inductive or radiant energy. In other embodiments, the carrier 305 is a heated chuck configured for internal (e.g., resistive) heating. The lift mechanism 320 and electrode spacing can be controlled by a computer system. The apparatus of the illustrated embodiment comprises an insulating body 330 to electrically isolate the powered showerhead plate 310 from the substrate 300. RF current is provided to the showerhead 310 through an RF impedance matching box 340. RF current is directed to ground via the impendence matching box 340.

Non-plasma Reactors

In some embodiments, non-activated reactants are utilized. Thus, the reactors do not need to have the capability to generate a plasma. The reactors described above can be adapted for use in such processes, as will be apparent to the skilled artisan. In some embodiments the reactors are utilized without modification and a plasma is simply not generated (i.e., processes are run using PEALD reactors without application of plasma power). The showerhead in such cases evenly distributes reactants across a substrate surface such that they vertically impinge on the substrate surface.

In other embodiments, reactors are utilized that do not have the capability of forming plasma. Exemplary reactors that can be used include the F120™, F450™, Pulsar™ and A412™ reactors available from ASM International (Bilthoven, Netherlands).

The reactor used in processes with non-activated reactants preferably comprises a showerhead or other feature for providing uniform distribution of reactants across the substrate surface. Preferably the showerhead introduces reactants perpendicularly to the wafer. Thus, a cross-flow type reactor is not used in the preferred embodiments. However, such a reactor may be used in some embodiments depending on the nature of the desired deposition.

Showerhead reactors are described, for example, in U.S. Pat. No. 6,820,570 and in U.S. application Ser. No. 10/428,207, filed Apr. 29, 2003 and 10/782,727, filed Feb. 18, 2004, the disclosures of which are incorporated herein by reference. The flow restriction through the showerhead is preferably high enough to allow a long diffusion time, such that the precursor can spread across the showerhead rather than being driven to the edge of the showerhead by the force of the vacuum pumps. In addition, exhaust pumping around the substrate is preferably sufficiently restricted to ensure that the reactant moves to the edge of the substrate slowly enough such that it contacts the substrate surface and enters the features on which deposition is desired.

Figure 3:
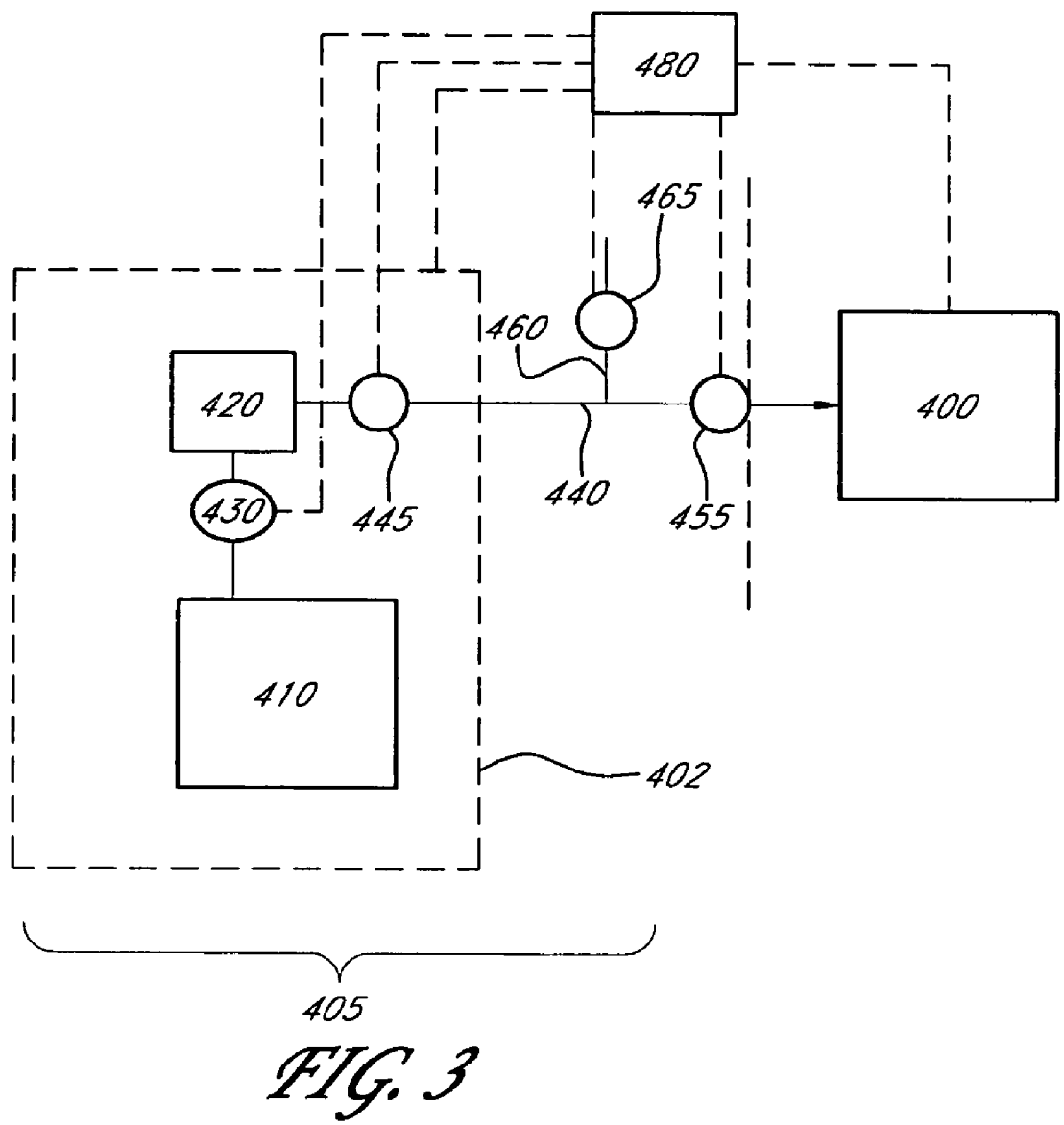
FIG. 3 is a schematic diagram of a dosage control mechanism for providing measured, under-saturated doses of a reactant to the reaction chamber in accordance with some embodiments of the invention.

In addition, preferred reactors for delivering non-activated species include a dosage control mechanism. Such a reactor is schematically illustrated in FIG. 3. The reactor preferably comprises software and hardware (e.g., computer system), including a dosage control mechanism 405 that allows for the provision of a particular dose of reactant to the reaction chamber 400. The reactant source hardware comprises a reactant source vessel 410 and a dosage chamber 420 with a controlled volume. The source vessel 410 and dosage chamber 420 are connected via a dosage control valve 430. The dosage control mechanism 405 preferably comprises a temperature controlled environment 402, such that the source vessel 410 and the dosage chamber 420 can be maintained at the same temperature. The dosage chamber 410 is connected to the reaction chamber 400 via line 440 and valves 445 and 455. The dosage control mechanism 405 may contain an additional line 460 and valve 465 for directing another reactant into the reaction chamber 400. In some embodiments, line 460 is used to provide a carrier gas (e.g., $H_2$, Ar) to carry a precursor into the reaction chamber 400. While one line 460 and valve 465 are shown, it would be appreciated that other lines and valves (as well as other processing units, such as, e.g., reactant source vessels and dosage chambers) may be included in the dosage control mechanism 405.

Various aspects of the dosage control mechanism 405 are controlled by a control system (or controller) 480 configured to control, for example, the valves 430, 445, 455 and 465; the temperature of the reactant source vessel 410; and the temperature and volume of the dosage chamber 420. The controller 480 is in communication with (dotted lines) various processing units, including the valves 430, 445, 455 and 465, and the temperature controlled environment 402. The controller is configured to control the flow rate of gas through lines 440 and 460 by controlling the valves 430, 445, 465 and 455, and/or the back pressure in each of the lines. The controller 480 is configured to control the temperature within the temperature controlled environment 402. The controller 480 is preferably configured to separately control the temperature of the temperature controlled environment 402 and the temperature of the reaction chamber 400. In preferred embodiments, heating and cooling of the temperature controlled environment 402 is controlled separately from heating and cooling of the reactor 400. Thus, in some embodiments, the reaction chamber 400 and the temperature controlled environment 402, which includes the reactant source vessel 410 and the dosage chamber 420, are maintained at different temperatures.

The dosing of the precursor is preferably made independent of the pulse length and is established by the temperature and volume of the dosage chamber 420. In some embodiments the volume of the dosage chamber 420 can be adjusted to accommodate the desired dose of precursor at a given temperature.

The dosage of precursor selected to provide the desired coverage of a substrate feature can be approximated based on a number of factors, including the nature of the precursor, the size of the substrate and the number and depth of the features into which non-conformal deposition is desired. Based on this calculation, the temperature of the dosage control mechanism 405 and/or the size of the dosage chamber 420 can be adjusted such that when the dosage chamber 420 is filled with precursor it contains the desired under-saturated dosage. That is, when filled the dosage chamber 420 will contain approximately the desired number of molecules of precursor. Typically, the source vessel 410 and dosage chamber 420 are cooled to lower the vapor pressure of the precursor. By cooling the source vessel 410 and the dosage chamber 420, the vapor pressure of the precursor (which is a function of temperature) can be controlled to effect an under-saturated dose of the precursor.

In other embodiments, an under-saturated dose of a precursor is achieved by controlling, e.g., the flow rate and pressure of a carrier gas provided through line 460. As an example, the flow rate of the carrier gas may be adjusted such that a predetermined precursor partial pressure is achieved in the feed to the reaction chamber 400.

In other embodiments the dosage to achieve the desired coverage can be obtained by a trial and error method, in which the dosage is reduced or increased based on previous results. The initial dosage may be one that is known to provide saturating coverage or may be based on an estimation of the approximate dosage needed to provide the desired coverage. The dosage may be varied by varying the temperature of the dosage control mechanism 405 and/or the size of the dosage chamber 420.

The reactor also comprises the necessary hardware and software to fill the dosage chamber 420 with precursor and to provide that dose to the reaction chamber 400, including the ability to control the temperature (and pressure) of the temperature controlled area 402 of the dosage control mechanism 405, as well as the state of the valves 430, 445 and 455.

In some embodiments the reactor comprises a dosage control mechanism 405 to regulate the dosage of a single reactant. In other embodiments, multiple dosage control mechanisms 405 are used to provide the desired dosage of each of a plurality of reactants.

Figure 7:
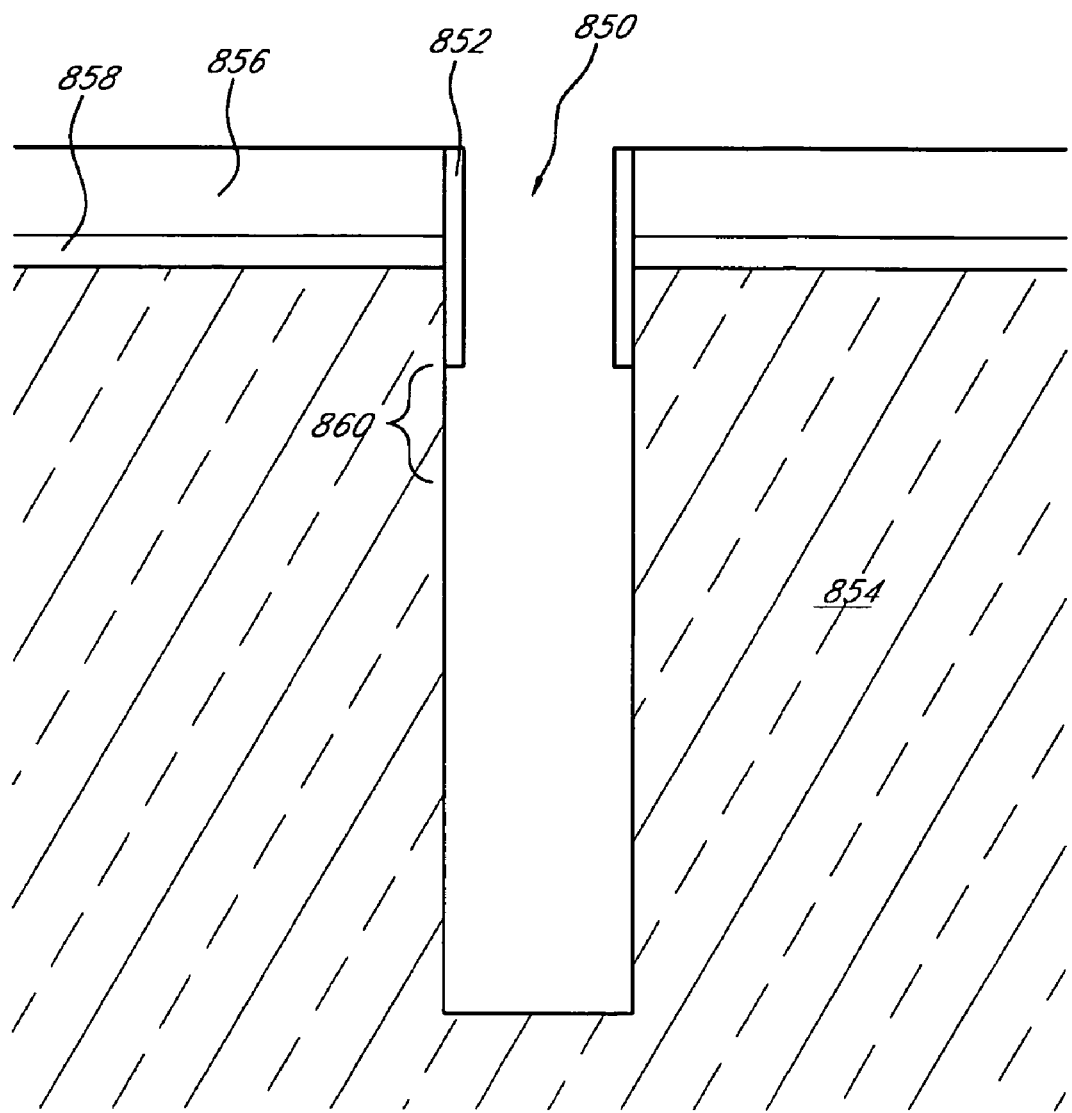
FIG. 7 is a schematic cross section of an insulating collar of the upper regions of a DRAM capacitor trench, deposited by method described herein.
Figure 8:
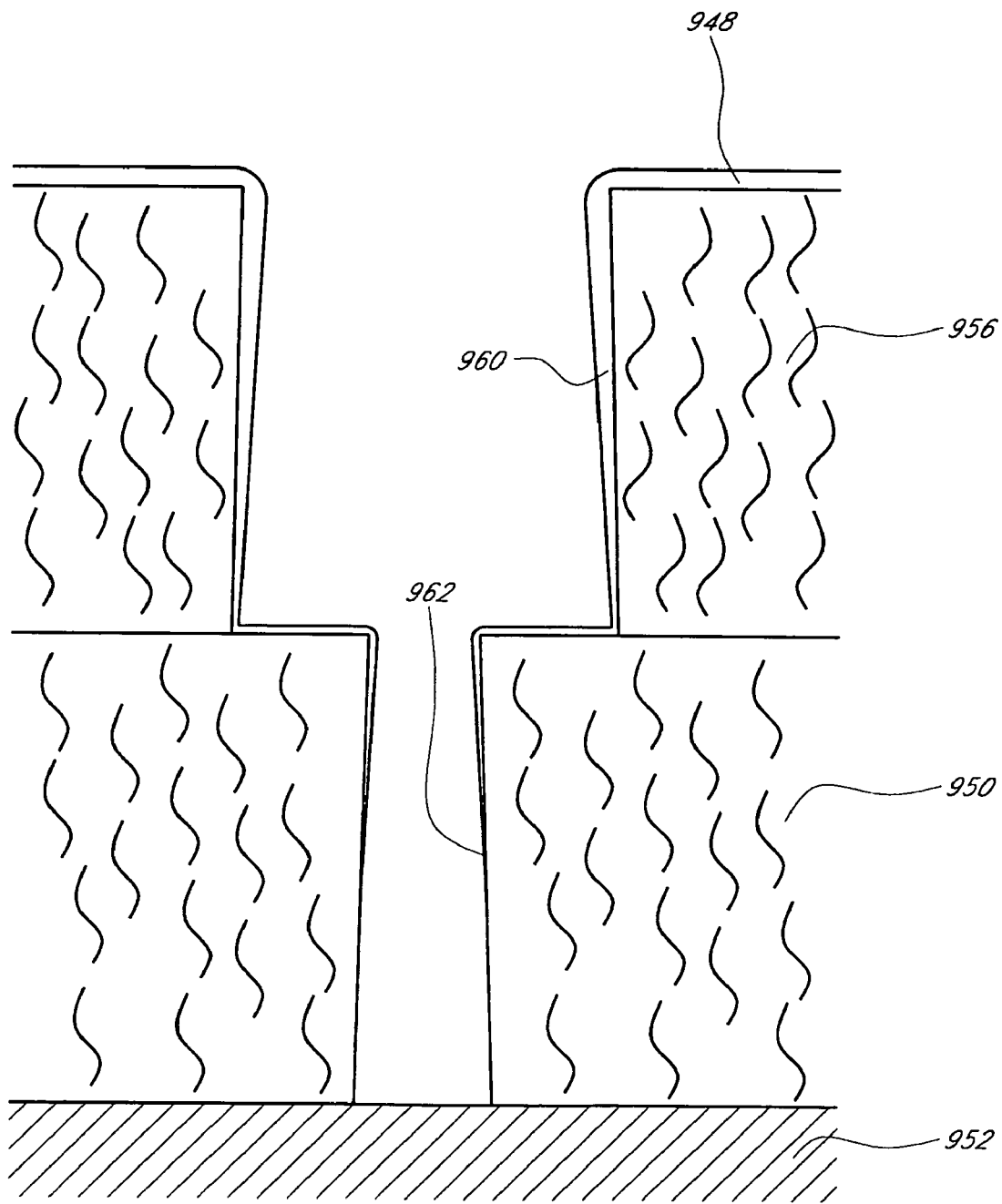
FIG. 8 is a schematic cross section of a dual damascene trench and via coated by a non-conformal layer deposited by methods described herein.

In an exemplary reaction, alternating pulses of a first and second reactant are provided to the reaction space to deposit a thin film a portion of the way down a trench in a substrate, as illustrated in FIGS. 7 and 8 (described in more detail below). Provision of the first reactant is conventional (saturative), while provision of the second reactant is by means of a dosage control mechanism 405. The temperature of the dosage control mechanism 405 and the size of the dosage chamber 410 are adjusted to provide the desired under-saturating dose of the second precursor.

The first reactant is provided to the reaction space and chemisorbs to the substrate surface. A saturating dose is utilized such that all available binding sites are saturated. Dosage control valve 430 and valve 455 are closed and the source line 440 is pumped down to a target pressure, preferably about 1 to 3 torr. The line 440 is isolated and valve 445 is closed. The dosage chamber 420 is filled with reactant by opening the dosage control valve 430. After a period of time sufficient to fill the dosage chamber 420, dosage control valve 430 is closed and a dose of second reactant is provided to the reaction chamber by opening valves 445 and 455. The valves are preferably opened for a length of time that allows all of the reactant from the dosage chamber 420 to flow to the reaction chamber 400. Because the dose of the second reactant is under-saturating, it reacts with the adsorbed precursor only to the desired depth in the trench, thus providing the desired step coverage. In a subsequent dose of the first reactant, the first reactant does not adsorb deeper in the trench than the level reached by the second reactant, and deposition continues only to the desired depth in each deposition cycle. The provision of the first and second reactant is repeated in this way until a film of desired thickness has been deposited.

In other embodiments, the dose of the first reactant is under-saturating and is controlled with the dosage control mechanism 405 while the dose of the second reactant is saturating. A subsequent dose of the first reactant does not adsorb deeper in the trench than the level reached by the second reactant, and deposition continues only to the desired depth in each deposition cycle. In still other embodiments the doses of both the first and second reactants are under-saturating and are controlled by one or more dosage control mechanisms 405.

Preferred Processes

Figure 4:
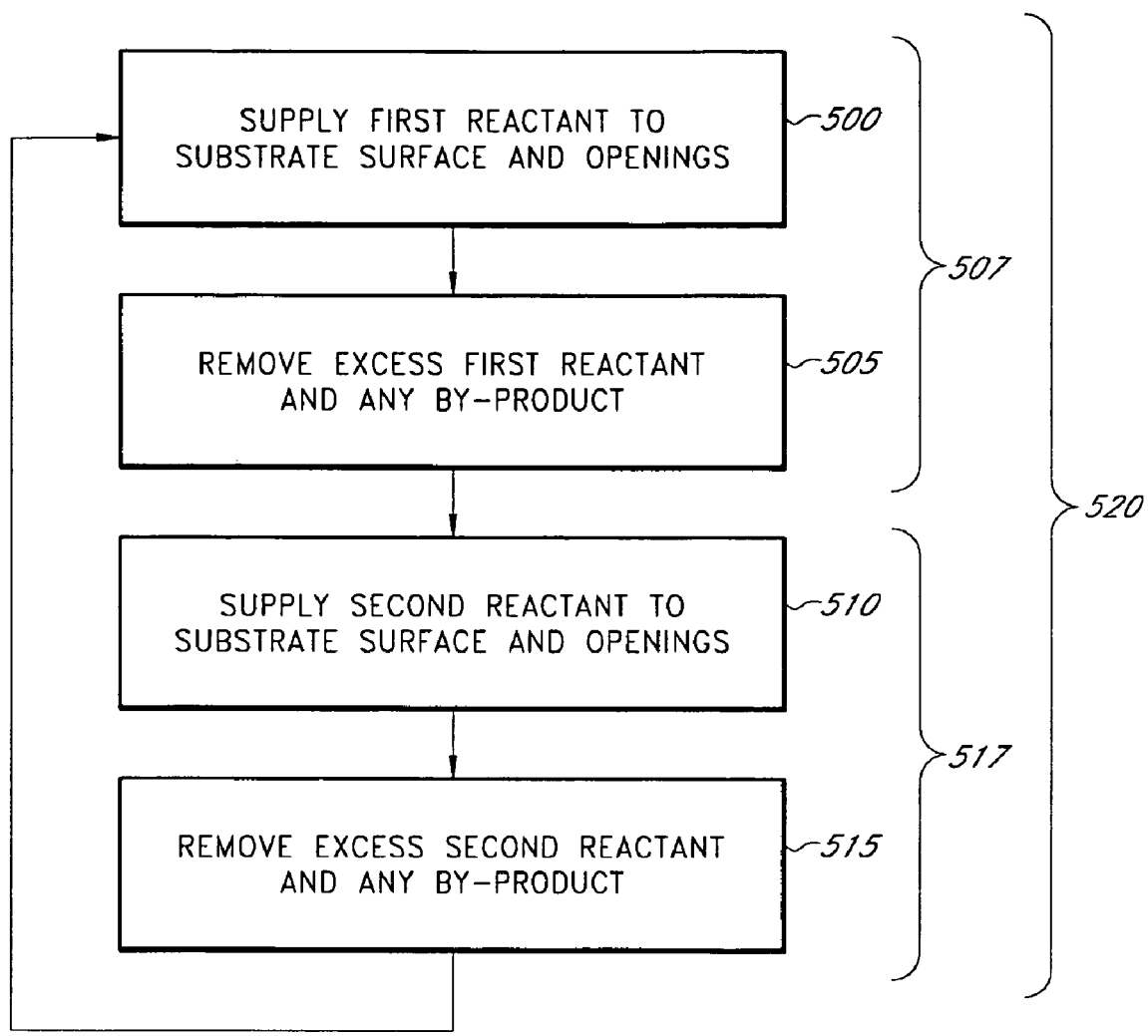
FIG. 4 is a flow chart illustrating processes for non-conformal, alternate and sequential deposition in accordance with some embodiments of the present invention.

FIG. 4 is a flow chart generally illustrating an alternating and sequential deposition process in accordance with some preferred processes. It should be noted that FIG. 4 is employed for illustrative purposes only, and for simplicity shows only two reactants; it will be understood that processes described herein can also be applied to processes employing three or more reactants in alternated and temporally separated pulses, and that other additional steps can be employed. For example, for some recipes it may be advantageous to supply two consecutive pulses of the same reactant, separated only by removal steps. As another example, the first cycle and/or subsequent cycles may employ initial surface treatments to nucleate the deposition process, depending on the reactant and surface chemistries, or may employ reduction steps that remove ligands without contributing elements to the film, in addition to precursor reactants that contribute to the film. Thus, for simplicity, the examples described herein illustrate typical two-reactant processes in which each reactant is a precursor for a metal, oxygen or nitrogen, and FIG. 4 is similarly simple for consistency.

After any surface preparation (e.g., cleaning and nucleation), a first reactant is supplied to the substrate and into openings in the substrate in a first reactant pulse 500. After sufficient reactant has been supplied to at least reach all surfaces over which deposition is desired, excess first reactant (and any reactant by-product) is removed in a first removal step 505. Removal 505 can comprise pumping down to vacuum; however, removal is more preferably accomplished by supplying inert gas as a purge step, as will be appreciated by the skilled artisan. Undesirable gas phase reactions between the first and second reactants in the reaction space above the substrate are avoided by the removal step, which is optimized to be as short as possible while ensuring spatial and temporal separation of mutually reactive reactants. The first reactant pulse 500 and the first removal step 505 together represent a first reactant phase 507.

Subsequently a second reactant is supplied to the substrate and into the openings of the substrate in a second reactant pulse 510. After sufficient second reactant has been supplied to at least reach all surfaces over which deposition is desired, excess second reactant (and any reactant by-product) is removed in a second removal step 515, preferably including purging with inert gas. The second reactant pulse 510 and the second removal step 515 together represent a second phase 517, and the first and second phases 507, 517 together represent a cycle 520 of the alternating and sequential deposition process. The cycle 520 is then repeated as many times as desired until a film of the desired thickness is formed.

Although the process is in fact a modification of true ALD, as will be appreciated from the more detailed discussion below, in accordance with ALD principles on at least some surfaces of the substrate each cycle 520 preferably has a self-limiting effect in that no more than about one monolayer of material forms per cycle 520. However, with extremely deep openings, such those illustrated in FIGS. 7-9, some CVD mode reactions may occur due to residual reactant in openings, as described in U.S. Pat. No. 6,759,325, incorporated herein above. Such CVD mode reactions can occur, for example, within the pores of a low k material (see FIG. 9 and attendant text). However, non-conformality into trenches can depend upon careful arrangement of deposition conditions to achieve depletion of reactants a desired depth into the openings. In this case, ALD mode self-limiting reactions can occur up to the desired depth, although not all surfaces are saturated.

In accordance with some embodiments, at least one of the first reactant and the second reactant is plasma-activated. More preferably, the plasma-activated reactant is activated in situ within the reactor directly over the substrate upper surface, as illustrated in FIGS. 1 and 2, in order to provide a uniform supply of activated species across the substrate (e.g., silicon wafer). Preferably conditions and reactants are selected such that the plasma-activated reactant is non-reactive unless activated. For example, for an ALD process in which trimethyl aluminum (TMA) and $O_2$ are alternated, temperature conditions are selected such that TMA will adsorb upon the substrate surfaces, particularly within the openings in the substrate, but $O_2$ will not react with the adsorbed TMA unless activated. Activation is then conducted (preferably by in situ plasma activation or remotely activated and supplied through a showerhead) such that full saturation of the substrate openings cannot occur. Rather, the reactants (here, the activated reactants) have a limited supply such that the likelihood of activated species reaching surfaces of the openings diminishes with increasing depth into the openings. By careful selection of plasma pulse conditions, the selected depth can be readily achieved, resulting in non-conformal or poor step coverage, where step coverage is defined as the amount of deposition at the top surface of the substrate as a ratio of the amount of deposition at lower or more distant portions of the openings.

PEALD is particularly suited to such limited supply of reactant. The lifespan of plasma-activated species (e.g., ions, neutral radicals, etc.) is naturally limited under any given conditions, and conditions during the plasma pulse can be manipulated to ensure a lifespan that corresponds with deposition up to the selected depth. Thus, in a PEALD embodiment, limited dosing can be achieved by timing or spacing modulation for the plasma, thereby limiting the amount of activated reactant rather than limiting the amount of reactant.

PEALD parameters that can affect conformality include applied RF power, RF power on-time, pressure in the reactor, reactant concentration supplied to the glow discharge, total gas flow, and (in the illustrated reactor of FIG. 2) spacing between the RF electrodes (e.g., between the substrate and the powered showerhead plate for the illustrated embodiments). Of these, RF on-time and reactant concentration directly control the activated reactant dose supplied to the substrate during each plasma reactant pulse, and thus control the depth within substrate openings that reactions can reach. Plasma power, reaction chamber pressure, gas flow rates, and susceptor-showerhead (electrode) spacing, however, also affect the depth into the openings that activated reactants can reach by way of affecting diffuision, excited species lifespan and the type of reactants formed by the plasma.

For example, the spacing between the upper electrode (showerhead) and the substrate can be adjusted such that activated reactants with a relatively short half life are only able to reach a desired depth into a structure, such as a trench, on the substrate surface.

While reactant pulse duration and separation can also be modulated to produce CVD and depletion mode reactions, these parameters were held constant in experiments discussed below utilizing activated species. Advantageously, the plasma-controlling parameters are readily modulated, without the need to tune pulse duration and separation, to control the depth into openings that deposition reaches. The plasma parameters, modulating the effective supply of activated species rather than the source molecules, does not depend upon external parameters such as bubbler efficiencies, which can change over time. At the same time, many degrees of freedom are provided by the aforementioned plasma parameters to control the transport properties and lifespan of activated species. Furthermore, PEALD tends to result in higher density and higher purity films compared to thermal ALD processing.

Note that, while discussed in terms of the control of plasma conditions, and particularly in situ plasma conditions, to ensure survival of activated species only up to a desired depth into the openings, the skilled artisan will readily appreciate that the advantages and principles taught herein can be applied to other activation means. For example, remote microwave radical generators, catalytic activation, ozone generators, UV activation, etc. can all be used to activate reactants for vapor deposition processes. However, the in situ showerhead plasma reactors of the preferred embodiments have the distinct advantage that the controlled conditions and limited lifespan apply uniformly across the substrate, since the distance from the glow discharge can be the same for each opening in this case. Other methods of activation will often entail differential path lengths, and hence differential radical survival rates, to different points across the substrate.

Further, the showerhead can be utilized to provide an even distribution of non-radical reactants across a substrate surface, as discussed in the context of FIG. 3. One or both reactants can be controlled to avoid deposition beyond a desired depth in a feature.

With reference still to FIG. 4, because the process is cyclical, it does not matter which of the two reactants is activated by the plasma. While it is possible that both reactants-are activated, preferably one reactant is stable (non-activated) and adsorbs in a self-limiting manner upon surfaces of the substrate. For convenience, the first reactant in FIG. 4 will be treated herein as the non-activated reactant. While it may be supplied in amounts calculated to reach just the desired depth, preferably the first reactant is not so strictly controlled and is supplied in the first reactant pulse 500 in sufficient quantities to at least saturate surfaces up to the desired depth into the openings, and more preferably sufficient to saturate much deeper into the openings than deposition is desired. Because the second reactant pulse 510 is controlled to react only to a particular depth, and because subsequent first reactant pulses 500 continue to be provided under ALD conditions, non-reacted first reactant (or portions thereof) that are adsorbed deep in the openings (i.e., deeper than reached by the second reactant or radical pulses 510) are unaffected by addition first reactant of subsequent first reactant pulses 500; additional first reactant finds no reactive sites for adsorption. Thus less than a monolayer of first reactant is left deep in the openings due to steric hindrance.

In one example, suitable for application to the embodiment of FIG. 7, ALD of $Al_2O_3$ is performed by alternating an aluminum source, such as trimethyl aluminum (TMA) with an oxygen source such as $O_2$. Preferably reactor conditions are maintained such that the non-activated oxygen source is non-reactive with adsorbed first reactant. Thus, the second reactant ($O_2$) reacts with adsorbed first reactant (TMA) only when the oxygen is activated, and the lifespan and transport properties of activated oxygen ($O^*$), as well as the distance between the showerhead and the substrate, dictate how deep into the substrate openings the reactions can occur. In another example, suitable for application to the embodiment of FIGS. 8 and 9, the first reactant comprises $TiCl_4$ and the second reactant comprises $N_2$ and $H_2$, which reacts with adsorbed portions of $TiCl_4$ only when activated under the selected substrate temperature.

Figure 5:
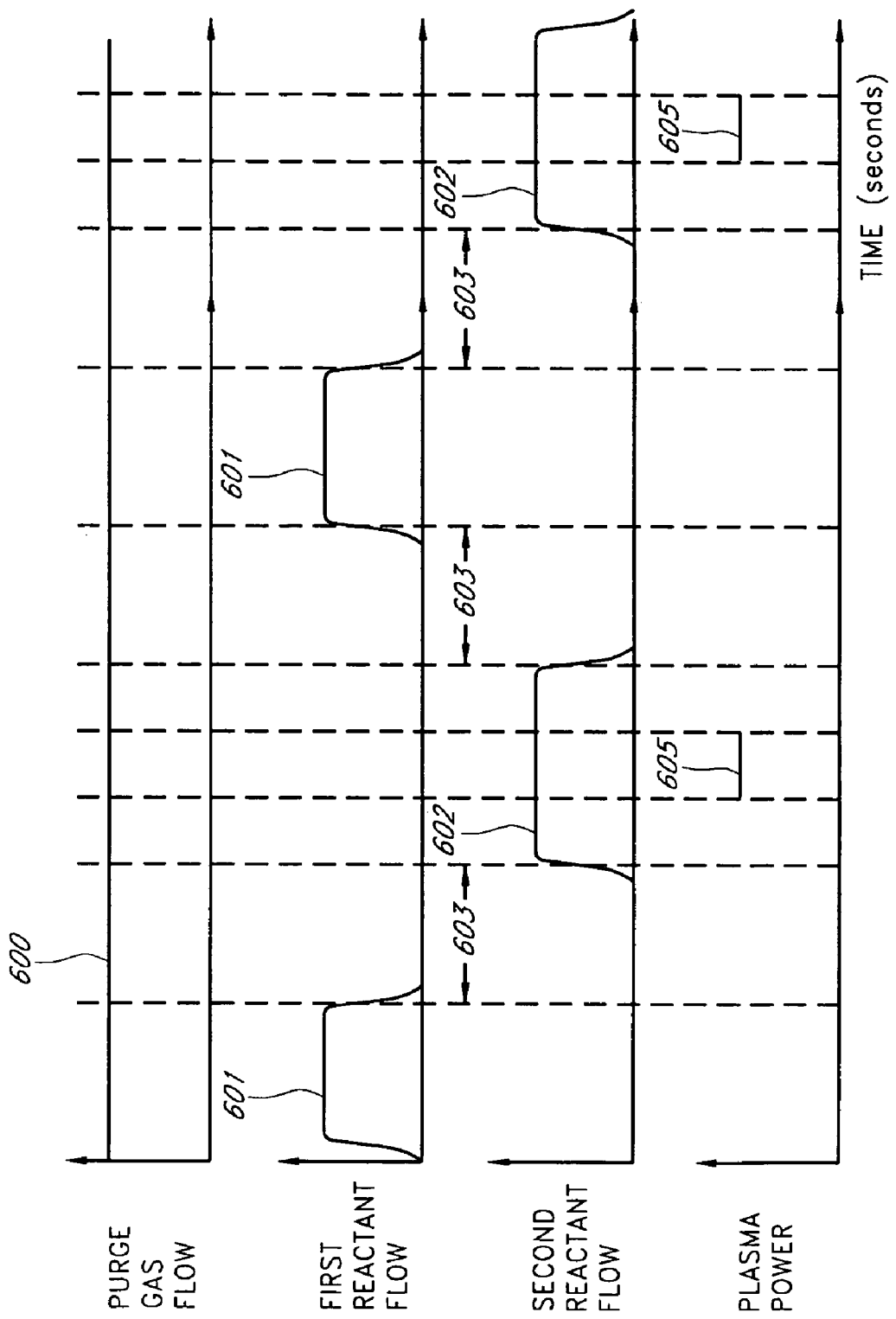
FIG. 5 is a graph illustrating reactant pulse and RF power timing in accordance with a particular process recipe for obtaining non-conformal deposition.
Figure 6:
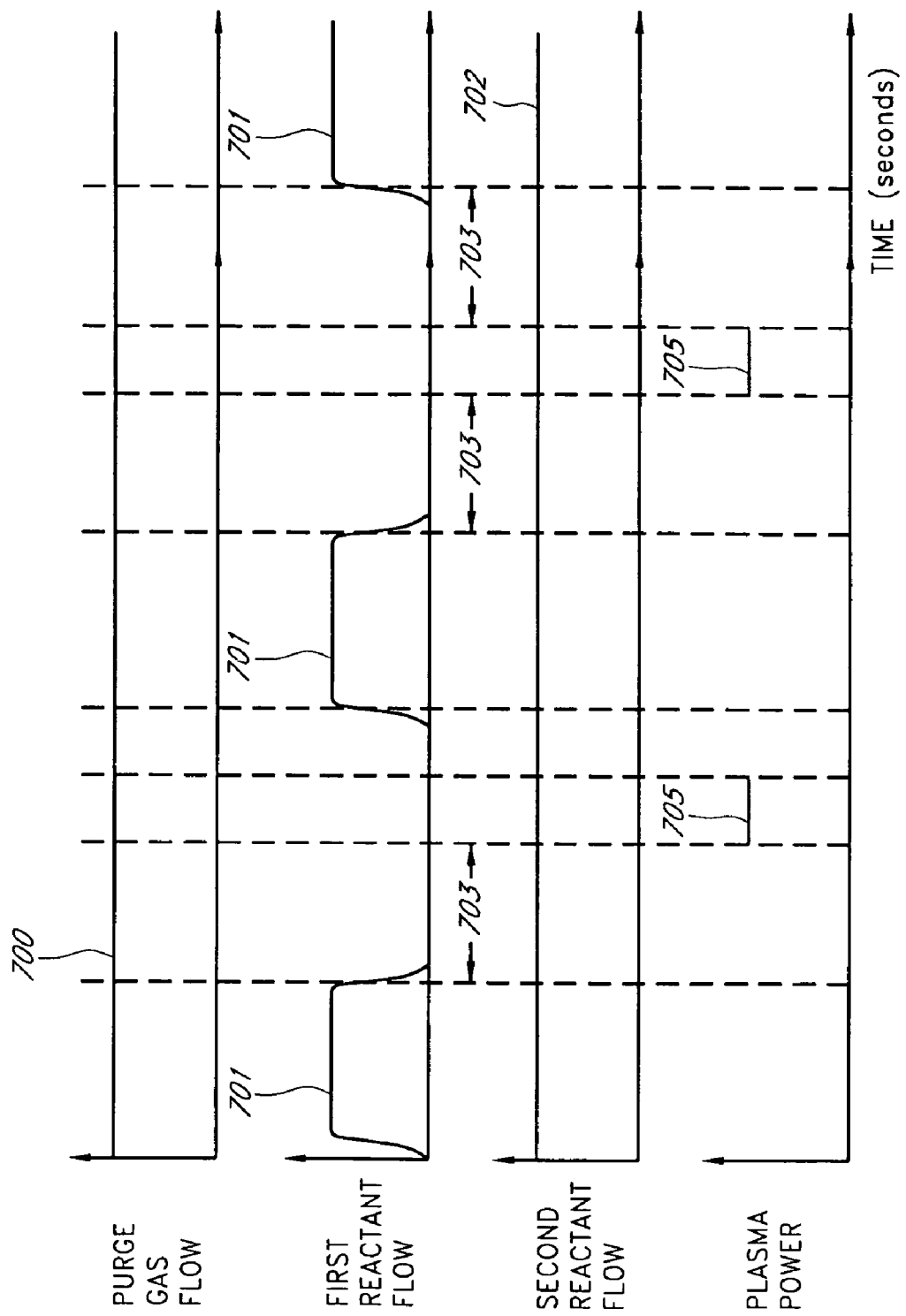
FIG. 6 is a graph illustrating reactant pulse and RF power timing in accordingly with another process recipe for obtaining non-conformal deposition.

FIGS. 5 and 6 illustrate two process recipes, each illustrating two cycles of PEALD processes optimized to achieve controlled conformality with less than 100% step coverage. In essence, each process is arranged to produce less than saturative surface reactions, such that activated reactants are "depleted" over a specified depth into openings in the substrate. In the following description, the first reactant will be assumed to be TMA and the second reactant will be assumed to be $O_2$ for a more concrete understanding of the operation of the selected embodiment. In the examples of FIGS. 5 and 6, RF power on-time is modulated. The skilled artisan will readily appreciate, however, that others of the above-noted plasma parameters can instead (or in addition) be modulated to control the depth of deposition.

In FIG. 5, purge gas 600 flows at a constant rate throughout the process. As will be appreciated by the skilled artisan, in other embodiments purge gas can instead be provided only between reactant pulses, or the flow rate can be increased during purging between reactant pulses to minimize pressure fluctuations. First reactant or TMA pulses 601 are provided alternately and sequentially with second reactant or $O_2$ pulses 602, separated by periods of purging 603. While illustrated as the same duration of purging after TMA pulses 601 as after $O_2$ pulses 602, in reality little purging is needed after $O_2$ activation due to the quickness with which activated species recombine or die off after plasma power is turned off. During a portion of $O_2$ pulses 602, a pulse 605 of plasma power is provided. The duration and power of the power pulse 605 is selected to provide active oxygen species to the desired depth within the substrate openings, such that only part of the surface receives deposition. In the illustrated embodiment, $O_2$ pulse duration and separation is not critically controlled; rather, the power pulse and amplitude provides control over the extent of reaction such that less than fully saturative reactions take place.

In FIG. 6, purge gas 700 again flows at a constant rate throughout the process, but can instead be provided only between reactant pulses, or the flow rate can be increased during purging between reactant pulses. First reactant or TMA pulses 701 are provided intermittently, while $O_2$ is provided in a constant flow 702. In some embodiments, $O_2$ may also serve as the purge gas. In such a case, a separate purge gas flow 700 is not required. Between TMA pulses 701, preferably after a suitably long purging period 703 to remove excess TMA and by-product from the substrate, a pulse 705 of plasma power is provided. The duration and power of the power pulse 705 is selected to provide active oxygen species to the desired depth within the substrate openings, such that only part of the surface receives deposition. Even more so than FIG. 5, the $O_2$ supply is not critically controlled. Rather the plasma power pulse duration and amplitude, along with electrode spacing, provide control over the extent of the reaction such that less than fully saturative reactions take place.

As mentioned above, in some embodiments non-radical reactants can be utilized to deposit non-conformal layers. By providing controlled, under-saturated pulses of one or both reactants, step coverage can be controlled. Preferably a showerhead reactor is utilized such that precursor is introduced perpendicularly to the wafer and provided relatively uniformly across the substrate.

In one embodiment, a first reactant is provided that saturates the substrate surface, particularly within the substrate openings in which deposition is desired. In some embodiments, the deposition depth of the first reactant within the substrate openings is at least that of the second reactant. In some cases, the deposition depth of the first reactant within the openings may exceed the deposition depth of the second reactant. An under-saturated dose of a second reactant is then provided to the reaction chamber, where it is able to react with (a portion of) the adsorbed first reactant. An under-saturated dose is one in which the amount of reactant is limiting and does not fully saturate the substrate. Rather, the second reactant has a limited supply such that the likelihood of the second reactant reaching surfaces of the openings (or other features) diminishes with increasing depth in the feature. Thus, the second reactant is only able to react with adsorbed first reactant to a certain depth within the opening. By carefully selecting the dose of the second reactant, deposition to the desired depth within the opening can be obtained, resulting in the desired step coverage.

In other embodiments the dose of the first reactant is under-saturating and the dose of the second reactant is saturating. In still other embodiments, under-saturating doses of both the first and second reactant are utilized.

The amount of precursor provided in each pulse is influenced by a number of factors, including the pressure in the source line, the vapor pressure of the substrate, the operation of the pulsing valves and the mass flow/pressure controller. Because of variability associated with these factors, it can be difficult to obtain the desired under-saturated pulse by controlling pulse length. For example, a change in pulse length of 25% can lead to an 80% higher dose at pulse lengths below 100 ms. In order to provide the desired under-saturated pulse of reactant and avoid variability that can be associate with these factors, the dose of the under-saturating reactant is preferably predetermined, such that the amount of reactant is essentially independent of pulse length. In each pulse of the reactant, the pulse length is kept long enough that the entire under-saturating dose of the reactant is provided to the reaction space. One way of controlling the dose is to utilize a dosage control mechanism as described above and illustrated in FIG. 9. Other ways of providing a specific dose of reactant to the reaction space will be apparent to the skilled artisan.

An exemplary depletion-mode atomic layer deposition (ALD) type process using non-radical reactants for depositing a thin film to a desired depth within a feature, such as a trench, is illustrated in FIG. 4. For convenience the first non-radical (or non-plasma activated) reactant will be considered the saturating pulse. While it is possible that under-saturated pulses of both reactants may be utilized, economic and other considerations usually favor utilizing a saturating pulse of at least one reactant. The first non-radical reactant is supplied in the first reactant pulse 500 in sufficient quantities to saturate the surfaces of the substrate. Preferably the opening in which limited deposition is desired is saturated deeper into the opening than deposition is desired.

The dosage of the second non-radical reactant in the second reactant pulse 510 is controlled such that reactant reaches only into the opening to the desired level of deposition. In this way, the second non-radical reactant is only available to react with material adsorbed from the first non-radical reactant to the desired depth. In this way, a thin film is deposited only to the desired depth in the feature.

Subsequent first non-radical reactant pulses 510 are provided under ALD conditions. As a result, no additional first non-radical reactant is able to adsorb deeper in the feature than the level reached by the second non-radical reactant and deposition continues only to the desired depth in each deposition cycle 520. The deposition cycle 520 is repeated until a non-conformal thin film of the desired thickness has been formed.

Exemplary Openings for Non-conformal Deposition

FIG. 7 shows a DRAM capacitor trench 850 having an insulating collar 852 deposited by one of the methods described herein. Initially a substrate 854 is masked, and a hard mask layer 856 is patterned thereover. For example, the hard mask layer 856 can comprise silicon nitride, shown overlying a pad oxide 858 to relieve stress from the silicon nitride hard mask 856. The trench 850 is etched through the hard mask.

State-of-the-art DRAM trenches are currently about 5-10 μm deep with openings of about 50-130 nm in width, thus representing an aspect ratio greater than 20:1 and more typically between about 35:1 and 200:1. The width of the collar 852 is preferably less than about 25% of the width of the trench 850. In some embodiments, the width of the collar 852 is up to about 50% of the depth of the trench 850. It will be appreciated that the depth and width of the trench 850 and the width of the collar 852 can be selected by the skilled artisan based on particular circumstances.

The insulating collar 852 serves to isolate the contact to a top capacitor electrode (not shown), which is subsequently deposited in the trench 850, from the bottom capacitor electrode, which is formed by the trench sidewalls of the substrate. If the material comprising the insulating collar deposits over the hard mask layer, a subsequent removal step (e.g., anisotropic wet etch or chemical mechanical polishing) may remove the insulating material from above the hard mask layer 856. After the illustrated stage of fabrication, sidewalls of the trench 850 are lined with a thin capacitor or cell dielectric, and the trench 850 is filled with the top electrode (e.g., polysilicon) material, and contact is made to the top electrode through the collar 852. Thus, the insulating collar 852 should be thick enough to adequately isolate the contact from the trench sidewall, but preferably does not extend too deep into the trench 850, since the majority of the trench should be lined only with a very thin capacitor dielectric.

In some embodiments, the collar 852 may be used as an etch mask to protect openings of trenches and/or vias from etching chemistries. This may be used in cases in which, for example, the area of a trench is to be increased without increasing the diameter of an opening of the trench. In such a case, the collar 852 may be formed, for example, of $Al_2O_3$.

The processes described herein are advantageously capable of producing a relatively uniform thickness of the collar 852 for a controllable depth into the trench 850. Beyond the selected depth, the process is such that the thickness relatively rapidly drops off over a short distance 860. Preferably the distance 860, over which the thickness drops from >90% of the thickness at the top of the collar 852 to <10% of the thickness at the top of the collar, is less than 1 µm, more preferably less than 0.5 µm.

Figure 9:
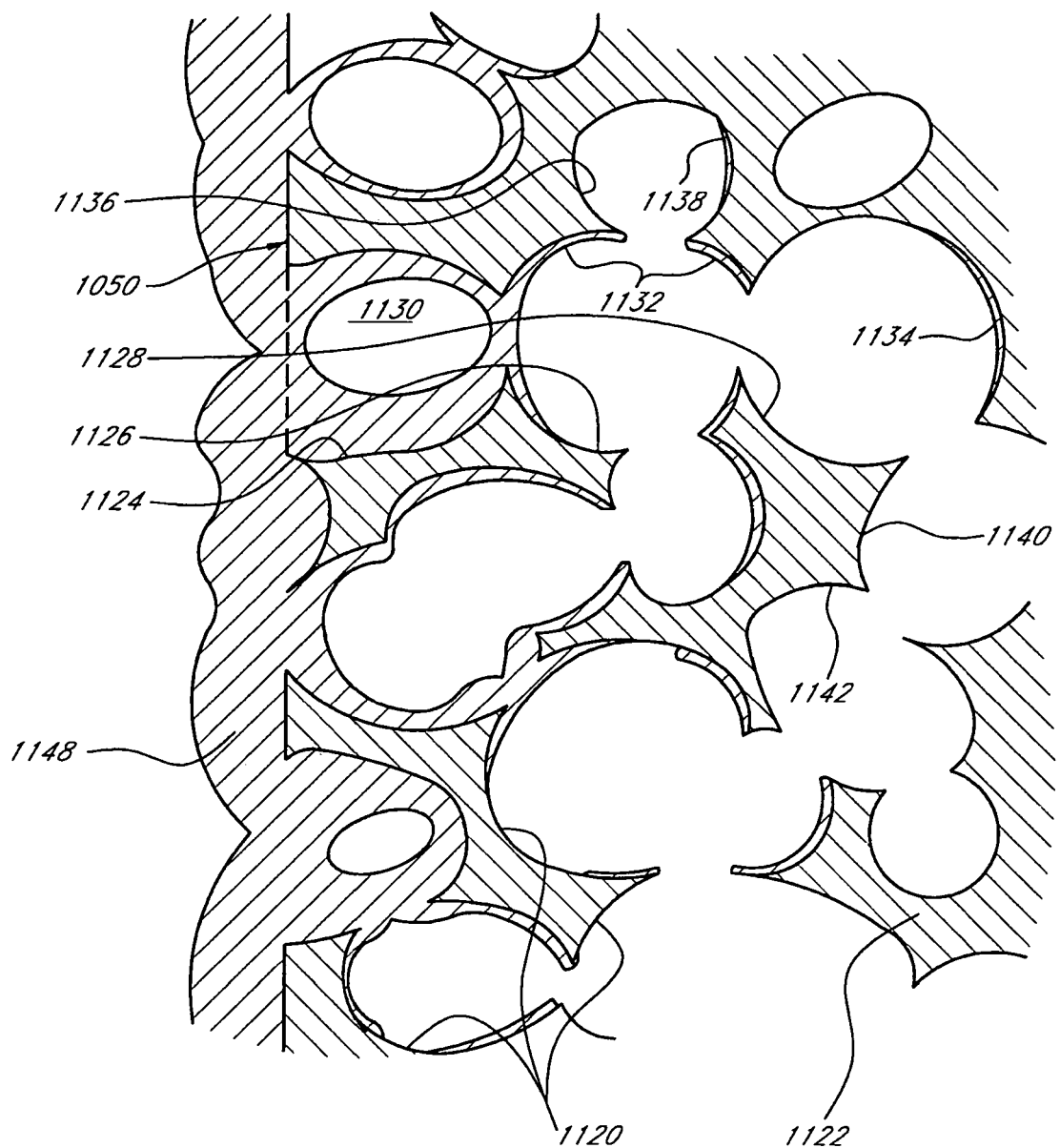
FIG. 9 is an enlarged cross section showing blocked pores in walls of the dual damascene structure of FIG. 8.

With reference now to FIGS. 8 and 9, a dual damascene structure, including a plurality (one shown) of trenches 960 in an upper porous insulating layer 956 and a plurality (one shown) of vias 962 in a lower porous insulating layer 950, is shown. The lower insulator is formed over a substrate 952, which may include lower structures, such as, e.g., a metal line, transistors, capacitors, resistors, inductors and local interconnects. In the illustrated embodiment, the substrate 952 is a lower conductive element. The structure is shown after low conformality deposition of a layer in accordance with another embodiment of the present invention. The sealing layer 948 is formed with low conformality such that, although conductive, it does not penetrate to the extent of creating short circuits among conductive elements of the integrated circuit. The sealing layer is preferably a conductive material (e.g., tungsten, TaN, TiN, WN), but since the layer can be controlled to avoid deposition on the floor of the trench or via, the sealing layer can also be an insulating material. Preferably the deposition conditions are selected such that sealing layer 948 penetrates no more than about 3 pore depths into the pore network of the insulating layers 950, 956.

In one embodiment, the insulating layers 950, 956 demonstrate anisotropic pore structure, particularly vertical alignment. Such insulators can be the product of the AURORA® process, commercially available from ASM Japan K.K. of Tokyo, Japan. A description of the AURORA® process is given in U.S. Pat. No. 6,455,445, issued Sep. 24, 2002 to Matsuki and assigned to ASM Japan K.K., the disclosure of which is expressly incorporated herein by reference. As discussed therein, a siloxan polymer insulation film has a dielectric constant of 3.3 or lower and has —$SiR_2O$— repeating structural units. The siloxan polymer is formed by directly vaporizing a silicon-containing hydrocarbon compound expressed by the general formula $Si_\alpha O_\beta C_x H_y$ (where α, β, x, and y are integers) and then introducing the vaporized compound to the reaction chamber of a plasma CVD apparatus. The residence time of the source gas is lengthened by reducing the total flow of the reaction gas, in such a way as to form a siloxan polymer film having a microporous structure and a low k-value. Of course, other processes may also produce anisotropic pore structures, and the methods described hereinbelow will also have application for layers produced by such other processes.

The alternating deposition processes discussed hereinabove may be employed to take advantage of the controlled conformality afforded by the processes. As noted above, the anisotropic pore structure of some low k materials renders full sidewall coverage of the openings, namely the trenches 960 and vias 962 in the illustrated structure, unnecessary. Accordingly, the alternating deposition process can be tailored to avoid full coverage of the sidewalls, and consequently little if any deposition occurs on the via bottom over the lower conductive element 952. Advantageously, minimizing occupation of the trenches and vias maximizes the volume available for filler metal, such as copper. Furthermore, if an insulating material is selected for the sealing layer 948, no spacer etch or other selective etch is required to clear the via bottom prior to further lining/filling of the damascene structure.

As discussed above, in some embodiments the alternating deposition process preferably operates in a depletion mode such that an intermediate level of conformality, between that of self-saturating ALD and CVD, is achieved. The comparisons presented herein are relative to an ALD process utilizing the same reactants or precursors, but optimized for self-saturating, self-limiting reactions over all sidewall and horizontal surfaces of the damascene structure. Such true ALD reactions can be assured by selecting extremely long (e.g., several minutes) reactant and purge durations; however, the skilled artisan will readily appreciate that such a true ALD process (referenced for comparative purposes in the present context) will be "optimized" by utilizing the minimum purge and pulse durations that will accomplish self-saturating and self-limiting reactions.

The above sealing processes are particularly useful to prevent filling openings by subsequent ALD processes, as discussed above. However, it will be appreciated that such sealing can also be useful to prevent subsequent diffusion from a variety of sources into the openings of a porous structure.

As shown in FIG. 9, none of the pores are completely filled. The first pore 1124, open to the via 962 (FIG. 8), is largely filled with the material of the sealing layer 1148. Due to imperfect conformality, however, the sealing layer 1148 has pinched off the opening to the first pore 1124 before complete filling, leaving a void 1130 within the first pore 1124. The second pore 1126 is shown with a very thin coating 1132 of the pore walls that can in some instances be continuous. The third pore 1128 has only non-continuous deposits 1134, if any. Similarly, a fourth pore 1136, which also represents the third pore depth in terms of distance through the pores from the outer (via) surface of the low k material, has only non-continuous deposits, if any. In the illustrated embodiment, a fourth pore 1140 and a fifth pore 1142, both representing the fourth pore depth from the surface (along different paths), have no appreciable deposits.

If, as preferred, the sealing layer 1148 comprises a conductive material, current can conduct only as far as the second pore depth, as illustrated. While the discontinuous coatings 1134, 1138 raise some risk of arcing, the risk is minimal and inconsequential for most circuit designs. The skilled artisan will appreciate that some process flows and circuit designs will have very different tolerances (broader or narrower than that illustrated) for the amount of diffusion through the pores that is acceptable. Moreover, regardless of the amount of diffusion allowed during formation of the sealing layer 1148, blocking the pores will be advantageous in avoiding far more extensive diffuision during subsequent conformal ALD processes.

As noted above, in accordance with one embodiment, the sealing layer 1148 can comprise an insulating material such as silicon dioxide formed by the PEALD process with parameter(s) controlled to achieve depletion mode deposition in the least accessible openings (e.g., trenches, vias, pores) in the substrate. In this case, deposition of the sealing layer can followed by a selective etch to remove the insulating material from the floor of the via 962 (FIG. 8) and thereby expose the underlying conductive element. However, because of the extraordinary control over the depth into the openings, an insulating sealing film can be deposited to cover upper portions of sidewalls but not cover the bottom on the via, since activated species can be arranged to be depleted before reaching the via floor. Accordingly, an insulating sealing layer can be formed by the methods described herein without necessarily requiring a subsequent etch to clear the bottom of the via.

EXAMPLES

Experiments were conducted on $Al_2O_3$ deposition in the EmerALD 3000™ PEALD reactor described above with respect to FIG. 2. The PEALD process parameters tested included the RF on-time, RF power, pressure in the reactor, $O_2$/Ar ratio, and spacing between the grounded susceptor/substrate combination and the powered showerhead electrode. The tests were performed on blanket wafers to demonstrate that incomplete, rather than saturated, surface reactions can be obtained in a controlled manner by tuning the aforementioned variables. Testing of variables was conducted as indicated in the chart below:

| PEALD parameter | range of variables tested |
| --- | --- |
| RF on-time | 200-1000 milliseconds |
| chamber pressure | 1-5 Torr |
| $O_2$ line pressure | 3-30 Torr |
| plasma power | 50-400 Watts |
| showerhead spacing | 5-12.5 mm |

In each experiment, TMA pulse time was 75 milliseconds and the total cycle time was about 4 seconds, and these parameters were held constant during all experiments. Modulating $O_2$ line pressure affected the $O_2$/Ar ratio and thus the concentration of reactants activated by the plasma pulse.

Each of these parameters were found capable of consistently reducing the thickness/cycle deposited on a blanket wafer, indicating operation in a controlled depletion mode, as compared to saturative reactions of conventional ALD. For example, above a particular threshold value of plasma power pulse duration, the deposition rate did not change, indicating self-limiting, saturated surface reactions. Below the threshold, the deposition rate was reduced. Such incomplete ALD growth indicates feasibility of a non-conformal liner formation by direct plasma PEALD.

Although the foregoing invention has been described in terms of certain preferred embodiments, other embodiments will be apparent to those of ordinary skill in the art. For example, while processes are specifically provided particular lining materials, the skilled artisan will readily appreciate that alternating and sequential methods can be applied to other materials. Moreover, although illustrated in connection with dual damascene metallization and insulating collars for trench capacitors, the skilled artisan will appreciate variations of such schemes for which the methods disclosed herein will have utility. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

We claim:

1. A method for depositing a film on a semiconductor substrate, the method comprising:
    providing a substrate with a surface comprising regions with different levels of accessibility;
    providing a sequence of at least two different reactants in temporally separated and alternating reactant pulses, wherein at least one of the at least two different reactants is provided through a showerhead or otherwise provided in that it impinges vertically on the substrate;
    selecting plasma-enhanced atomic layer deposition (PEALD) conditions to achieve self-satuaration and self-limiting atomic layer deposition (ALD) mode deposition on the most accessible regions on the substrate surface and depletion effects in less accessible regions on the substrate surface; and
    exposing the semiconductor substrate to the sequence of the reactant pulses with the selected temporal separations and durations to deposit the film.

2. The method of claim 1, wherein the regions comprise top surface regions.

3. The method of claim 2, wherein the regions further comprise trench regions that are less accessible than the top surface regions.

4. The method of claim 2, wherein the regions comprise pore regions that are less accessible than the top surface regions.

5. The method of claim 1, wherein the substrate comprises a DRAM trench and the film comprises a collar extending only partially from a top surface of the substrate into the trench.

6. The method of claim 1, wherein selecting PEALD conditions comprises tuning at least one parameter selected from the group consisting of RF power on-time, RF power amplitude, frequency, reactant concentration, chamber pressure, total gas flow, reactant pulse durations and separations, and RF electrode spacing.

7. The method of claim 1, wherein providing a sequence of at least two different reactants in temporally separated and alternating reactant pulses comprises providing one reactant continuously and intermittently pulsing plasma power.

8. A method of controlling conformality of a deposited film on a semiconductor substrate, the method comprising:
    providing a substrate with a plurality of openings at a surface thereof
    alternately and sequentially supplying pulses of at least two different reactants to the substrate; and
    selectively activating at least one of the two different reactants in pulses, wherein selectively activating is controlled to have a depletion effect within the openings to less than fully cover surfaces of the openings.

9. The method of claim 8, wherein conformality of a deposited film is reduced in a controlled manner.

10. The method of claim 8, wherein selectively activating comprises activating a plasma within a deposition chamber directly over the surface.

11. The method of claim 10, wherein selectively activating comprises supplying the at least one of the reactants through a showerhead having openings extending across the substrate in face-to-face relation with the substrate.

12. The method of claim 11, wherein selectively activating comprises applying a first polarity to the showerhead and a second polarity to the substrate.

13. The method of claim 12, wherein the second polarity is ground.

14. The method of claim 8, wherein alternately and sequentially supplying pulses comprises supplying pulses of a first reactant, supplying a continuous feed of a second reactant, and selectively activating comprises pulsing plasma power to the second reactant between pulses of the first reactant.

15. The method of claim 8, wherein alternately and sequentially supplying pulses comprises alternating pulses of a first reactant with pulses of a second reactant, and selectively activating comprises pulsing plasma power during only portion of each pulse of the second reactant.

16. The method of claim 8, wherein the at least one of the two different reactants comprises a species non-reactive with the other of the two different reactants under deposition conditions in the absence of the selective activation.

17. The method of claim 16, wherein the at least one of the two different reactants comprises $O_2$.

18. The method of claim 16, wherein the at least one of the two different reactants comprises $N_2$.

19. The method of claim 8, wherein selectively activating comprises tuning at least one parameter selected from the group consisting of RF power on-time, RF power amplitude, frequency, reactant concentration, chamber pressure, total gas flow and RF electrode spacing.

20. The method of claim 8, wherein the openings comprise DRAM trenches and the deposited film comprises an insulating collar extending from the surface of the substrate into the trenches.

21. The method of claim 8, wherein the deposited film comprises a section having an end proximal to the substrate surface having a thickness greater than 90% of a thickness of the deposited layer at the substrate surface, the section having an end distal from the substrate surface having a thickness less than 10% of a thickness of the deposited layer at the substrate surface, the section having a length between the ends of less than about 1.0 μm.

22. The method of claim 21, wherein the section has a length between the ends of less than about 0.5 μm.

23. The method of claim 8, wherein the openings comprise trenches and pores in an insulating layer.

24. The method of claim 23, wherein the deposited film extends no more than about 3 pore depths into the insulating layer.

25. The method of claim 8, wherein the deposited film is an insulator.

26. The method of claim 8, wherein the deposited film is a conductor.

* * * * *

UNITED STATES PATENT AND TRADEMARK OFFICE
CERTIFICATE OF CORRECTION

PATENT NO.       : 7,608,549 B2
APPLICATION NO.  : 11/375588
DATED            : October 27, 2009
INVENTOR(S)      : Van Nooten et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 639 days.

Signed and Sealed this

Twelfth Day of October, 2010

David J. Kappos
*Director of the United States Patent and Trademark Office*